United States Patent
Miller et al.

(10) Patent No.: US 10,678,324 B2
(45) Date of Patent: Jun. 9, 2020

(54) SYSTEMS AND METHODS FOR AUGMENTED REALITY

(71) Applicant: MAGIC LEAP, INC., Plantation, FL (US)

(72) Inventors: Samuel A. Miller, Hollywood, FL (US); Michael J. Woods, Mountain View, CA (US); David C. Lundmark, Los Altos, CA (US)

(73) Assignee: Magic Leap, Inc., Plantation, FL (US)

(*) Notice: Subject to any disclaimer, the term of this patent is extended or adjusted under 35 U.S.C. 154(b) by 0 days.

(21) Appl. No.: 16/220,617

(22) Filed: Dec. 14, 2018

(65) Prior Publication Data
US 2019/0155374 A1    May 23, 2019

Related U.S. Application Data

(63) Continuation of application No. 15/425,837, filed on Feb. 6, 2017, now Pat. No. 10,180,734, which is a
(Continued)

(51) Int. Cl.
*G06F 3/01* (2006.01)
*G06F 3/0346* (2013.01)
(Continued)

(52) U.S. Cl.
CPC .............. *G06F 3/011* (2013.01); *G01B 7/004* (2013.01); *G01R 33/02* (2013.01); *G06F 3/012* (2013.01);
(Continued)

(58) Field of Classification Search
CPC ........ G06F 3/011; G06F 3/012; G06F 3/0346; G01B 7/004
See application file for complete search history.

(56) References Cited

U.S. PATENT DOCUMENTS

| 4,462,165 A | 7/1984 | Lewis |
| 5,280,265 A | 1/1994 | Kramer et al. |

(Continued)

FOREIGN PATENT DOCUMENTS

| CA | 2358682 | 3/1994 |
| CN | 101093586 | 12/2007 |

(Continued)

OTHER PUBLICATIONS

Non-Final Office Action for U.S. Appl. No. 14/641,376 dated Apr. 14, 2016.
(Continued)

*Primary Examiner* — Ryan R Yang
(74) *Attorney, Agent, or Firm* — Vista IP Law Group, LLP

(57) ABSTRACT

An augmented reality display system includes an electromagnetic field emitter to emit a known magnetic field in a known coordinate system. The system also includes an electromagnetic sensor to measure a parameter related to a magnetic flux at the electromagnetic sensor resulting from the known magnetic field. The system further includes a depth sensor to measure a distance in the known coordinate system. Moreover, the system includes a controller to determine pose information of the electromagnetic sensor relative to the electromagnetic field emitter in the known coordinate system based at least in part on the parameter related to the magnetic flux measured by the electromagnetic sensor and the distance measured by the depth sensor. In addition, the system includes a display system to display virtual content to a user based at least in part on the pose information of the electromagnetic sensor relative to the electromagnetic field emitter.

9 Claims, 24 Drawing Sheets

Related U.S. Application Data continuation-in-part of application No. 15/062,104, filed on Mar. 5, 2016.

(60) Provisional application No. 62/298,993, filed on Feb. 23, 2016, provisional application No. 62/292,185, filed on Feb. 5, 2016, provisional application No. 62/128,993, filed on Mar. 5, 2015, provisional application No. 62/292,185, filed on Feb. 5, 2016.

(51) Int. Cl.
```
G06T 19/00      (2011.01)
G01B 7/004      (2006.01)
G06F 3/0481     (2013.01)
G06T 7/55       (2017.01)
G06T 7/174      (2017.01)
G01R 33/02      (2006.01)
G01S 17/08      (2006.01)
G01S 13/02      (2006.01)
G02B 27/01      (2006.01)
G06T 7/521      (2017.01)
```

(52) U.S. Cl.
CPC ........ *G06F 3/0346* (2013.01); *G06F 3/04815* (2013.01); *G06T 7/174* (2017.01); *G06T 7/55* (2017.01); *G06T 19/006* (2013.01); *G01S 13/02* (2013.01); *G01S 17/08* (2013.01); *G02B 27/017* (2013.01); *G02B 2027/014* (2013.01); *G02B 2027/0112* (2013.01); *G02B 2027/0125* (2013.01); *G02B 2027/0127* (2013.01); *G02B 2027/0132* (2013.01); *G02B 2027/0138* (2013.01); *G02B 2027/0187* (2013.01); *G06T 7/521* (2017.01); *G06T 2207/10012* (2013.01); *G06T 2207/10028* (2013.01); *G06T 2207/20221* (2013.01)

(56) References Cited

U.S. PATENT DOCUMENTS

| | | |
|---|---|---|
| 5,592,401 A | 1/1997 | Kramer |
| 5,930,741 A | 7/1999 | Kramer |
| 6,377,401 B1 | 4/2002 | Bartlett |
| 6,407,736 B1 | 6/2002 | Regan |
| 6,701,296 B1 | 3/2004 | Kramer et al. |
| 7,375,529 B2 | 5/2008 | Dupuis et al. |
| 7,443,154 B1 | 10/2008 | Merewether et al. |
| 8,165,352 B1 | 4/2012 | Mohanty et al. |
| 8,401,308 B2 | 3/2013 | Nakamura et al. |
| 8,950,867 B2 | 2/2015 | Macnamara |
| 9,013,505 B1 | 4/2015 | Thorton |
| 9,160,727 B1 | 10/2015 | Saylor et al. |
| 9,215,293 B2 | 12/2015 | Miller |
| 9,417,452 B2 | 8/2016 | Schowengerdt et al. |
| 9,465,129 B1 | 10/2016 | Olsson et al. |
| 9,671,566 B2 | 6/2017 | Abovitz et al. |
| 9,791,700 B2 | 10/2017 | Schowengerdt |
| 9,814,430 B1 | 11/2017 | Berme et al. |
| 9,874,749 B2 | 1/2018 | Bradski et al. |
| 9,952,673 B2 | 4/2018 | Kramer et al. |
| 2001/0043738 A1 | 11/2001 | Sawney et al. |
| 2002/0033803 A1 | 3/2002 | Holzrichter et al. |
| 2002/0180727 A1 | 12/2002 | Guckenberger et al. |
| 2003/0092448 A1 | 5/2003 | Forstrom et al. |
| 2003/0120448 A1 | 7/2003 | Moriya et al. |
| 2003/0234823 A1 | 12/2003 | Sato et al. |
| 2004/0140949 A1 | 7/2004 | Takagi |
| 2004/0174337 A1 | 9/2004 | Kubota et al. |
| 2004/0201857 A1 | 10/2004 | Foxlin |
| 2005/0107870 A1 | 5/2005 | Wang et al. |
| 2005/0156601 A1 | 7/2005 | Dupuis et al. |
| 2006/0161871 A1 | 7/2006 | Hotelling et al. |
| 2006/0253804 A1 | 11/2006 | Fukushima et al. |
| 2007/0049374 A1 | 3/2007 | Ikeda et al. |
| 2007/0072674 A1 | 3/2007 | Ohta et al. |
| 2007/0298883 A1 | 12/2007 | Feldman et al. |
| 2008/0024523 A1 | 1/2008 | Tomite et al. |
| 2008/0133521 A1 | 6/2008 | Podilchuk |
| 2008/0275667 A1 | 11/2008 | Ohta |
| 2008/0309884 A1 | 12/2008 | O'Dor et al. |
| 2009/0005166 A1 | 1/2009 | Sato |
| 2009/0051653 A1 | 2/2009 | Barney et al. |
| 2009/0115406 A1 | 5/2009 | Anderson et al. |
| 2009/0173886 A1 | 7/2009 | Chowdhury |
| 2009/0184825 A1 | 7/2009 | Anderson |
| 2010/0066676 A1 | 3/2010 | Kramer et al. |
| 2010/0085423 A1 | 4/2010 | Lange |
| 2010/0141261 A1 | 7/2010 | Overby et al. |
| 2010/0302152 A1 | 12/2010 | Kirigaya |
| 2010/0309292 A1 | 12/2010 | Ho et al. |
| 2011/0018874 A1 | 1/2011 | Hasselgreen et al. |
| 2011/0025603 A1 | 2/2011 | Underkoffler et al. |
| 2011/0184950 A1 | 7/2011 | Skaff et al. |
| 2011/0199088 A1 | 8/2011 | Bittar et al. |
| 2011/0238399 A1 | 9/2011 | Ophir et al. |
| 2011/0248987 A1 | 10/2011 | Mitchell |
| 2011/0298748 A1 | 12/2011 | Chen et al. |
| 2012/0099800 A1 | 4/2012 | Llano et al. |
| 2012/0117076 A1 | 5/2012 | Austermann et al. |
| 2012/0194516 A1 | 8/2012 | Newcombe et al. |
| 2012/0236030 A1 | 9/2012 | Border et al. |
| 2012/0328196 A1 | 12/2012 | Kasahara et al. |
| 2013/0084984 A1 | 4/2013 | Gagner et al. |
| 2013/0117377 A1 | 5/2013 | Miller |
| 2013/0128230 A1 | 5/2013 | Macnamara |
| 2013/0169626 A1 | 7/2013 | Balan et al. |
| 2013/0230211 A1 | 9/2013 | Tanabiki et al. |
| 2013/0241773 A1 | 9/2013 | Laine |
| 2013/0278635 A1 | 10/2013 | Maggiore |
| 2013/0290222 A1 | 10/2013 | Gordo et al. |
| 2013/0312009 A1 | 11/2013 | Kramer et al. |
| 2013/0321462 A1 | 12/2013 | Salter et al. |
| 2013/0346168 A1 | 12/2013 | Zhou et al. |
| 2014/0006026 A1 | 1/2014 | Lamb et al. |
| 2014/0011589 A1 | 1/2014 | Barney et al. |
| 2014/0037140 A1 | 2/2014 | Benhimane et al. |
| 2014/0062841 A1 | 3/2014 | Ishikawa et al. |
| 2014/0075060 A1 | 3/2014 | Sharp et al. |
| 2014/0139226 A1 | 5/2014 | Jaaskelainen et al. |
| 2014/0145932 A1 | 5/2014 | Underkoffler et al. |
| 2014/0176591 A1 | 6/2014 | Klein et al. |
| 2014/0181587 A1 | 6/2014 | Sridharan et al. |
| 2014/0195988 A1 | 7/2014 | Kramer et al. |
| 2014/0212027 A1 | 7/2014 | Hallquist et al. |
| 2014/0222409 A1 | 8/2014 | Efrat et al. |
| 2014/0225822 A1 | 8/2014 | Underkoffler et al. |
| 2014/0267420 A1 | 9/2014 | Schowengerdt et al. |
| 2014/0267646 A1 | 9/2014 | Na'Aman et al. |
| 2014/0285375 A1 | 9/2014 | Crain |
| 2014/0298269 A1 | 10/2014 | Underkoffler et al. |
| 2014/0306866 A1 | 10/2014 | Miller et al. |
| 2014/0321702 A1 | 10/2014 | Schmalstieg |
| 2014/0323148 A1 | 10/2014 | Schmalstieg et al. |
| 2014/0325373 A1 | 10/2014 | Kramer et al. |
| 2014/0354548 A1 | 12/2014 | Lee |
| 2015/0002542 A1 | 1/2015 | Chan et al. |
| 2015/0019651 A1 | 1/2015 | Kazi et al. |
| 2015/0040074 A1 | 2/2015 | Hofmann et al. |
| 2015/0077326 A1 | 3/2015 | Kramer et al. |
| 2015/0092015 A1 | 4/2015 | Stafford |
| 2015/0100380 A1 | 4/2015 | Jones, Jr. et al. |
| 2015/0100593 A1 | 4/2015 | Underkoffler et al. |
| 2015/0161476 A1 | 6/2015 | Kurz et al. |
| 2015/0163345 A1 | 6/2015 | Cornaby et al. |
| 2015/0172568 A1 | 6/2015 | Choe et al. |
| 2015/0177831 A1 | 6/2015 | Chan et al. |
| 2015/0178554 A1 | 6/2015 | Kanaujia et al. |
| 2015/0178939 A1 | 6/2015 | Bradski et al. |
| 2015/0205126 A1 | 7/2015 | Schowengerdt |
| 2015/0205364 A1 | 7/2015 | Underkoffler et al. |
| 2015/0205388 A1 | 7/2015 | Osterhout |
| 2015/0215611 A1 | 7/2015 | Wu et al. |

(56) References Cited

U.S. PATENT DOCUMENTS

| | | | |
|---|---|---|---|
| 2015/0221133 A1 | 8/2015 | Groten et al. |
| 2015/0243080 A1 | 8/2015 | Steinbach et al. |
| 2015/0262372 A1 | 9/2015 | Cardoso et al. |
| 2015/0302652 A1 | 10/2015 | Miller et al. |
| 2015/0310310 A1 | 10/2015 | Hesch |
| 2015/0324198 A1 | 11/2015 | Alsup et al. |
| 2015/0339857 A1 | 11/2015 | O'Connor et al. |
| 2015/0346495 A1 | 12/2015 | Welch et al. |
| 2015/0358539 A1 | 12/2015 | Catt |
| 2015/0371082 A1 | 12/2015 | Csaszar et al. |
| 2015/0373369 A1 | 12/2015 | Jalai et al. |
| 2015/0379772 A1 | 12/2015 | Hoffman |
| 2016/0005233 A1 | 1/2016 | Fraccaroli et al. |
| 2016/0012643 A1 | 1/2016 | Kezele et al. |
| 2016/0018896 A1 | 1/2016 | Kramer et al. |
| 2016/0026253 A1 | 1/2016 | Bradski et al. |
| 2016/0041048 A1 | 2/2016 | Blum et al. |
| 2016/0171644 A1 | 6/2016 | Gruber |
| 2016/0180151 A1 | 6/2016 | Philbin et al. |
| 2016/0180592 A1 | 6/2016 | Bean et al. |
| 2016/0189680 A1 | 6/2016 | Paquette |
| 2016/0203624 A1 | 7/2016 | Anderson |
| 2016/0210783 A1 | 7/2016 | Tomlin et al. |
| 2016/0259032 A1 | 9/2016 | Hehn |
| 2016/0259404 A1 | 9/2016 | Woods |
| 2016/0262608 A1 | 9/2016 | Krueger |
| 2016/0282619 A1 | 9/2016 | Oto |
| 2016/0294958 A1 | 10/2016 | Zhang et al. |
| 2016/0299567 A1 | 10/2016 | Crisler et al. |
| 2016/0378863 A1 | 12/2016 | Shlens et al. |
| 2016/0379092 A1 | 12/2016 | Kutliroff |
| 2017/0011555 A1 | 1/2017 | Li et al. |
| 2017/0032220 A1 | 2/2017 | Medasani et al. |
| 2017/0076328 A1 | 3/2017 | Suzuki |
| 2017/0161853 A1 | 6/2017 | Gossweiler et al. |
| 2017/0161919 A1 | 6/2017 | Schroeder |
| 2017/0184387 A1 | 6/2017 | Lefevre et al. |
| 2017/0205903 A1 | 7/2017 | Miller et al. |
| 2017/0243324 A1 | 8/2017 | Mierle et al. |
| 2018/0039083 A1 | 2/2018 | Miller et al. |
| 2018/0047332 A1 | 2/2018 | Kuwahara |
| 2018/0107346 A1 | 4/2018 | Wilson |
| 2018/0213359 A1 | 7/2018 | Reinhardt et al. |
| 2018/0268518 A1 | 9/2018 | Nourai et al. |
| 2018/0268519 A1 | 9/2018 | Liebenow et al. |
| 2018/0268610 A1 | 9/2018 | Nourai et al. |
| 2019/0015167 A1 | 1/2019 | Draelos et al. |
| 2019/0056693 A1 | 2/2019 | Gelman et al. |
| 2020/0027194 A1 | 1/2020 | Nourai et al. |

FOREIGN PATENT DOCUMENTS

| | | |
|---|---|---|
| CN | 101530325 | 9/2009 |
| CN | 103792661 | 5/2014 |
| CN | 104011788 | 8/2014 |
| EP | 2887311 | 6/2015 |
| WO | WO 94/04938 | 3/1994 |
| WO | WO 2014/160342 | 10/2014 |
| WO | WO 2015134958 | 9/2015 |
| WO | WO 2016141373 | 9/2016 |
| WO | WO 2017096396 | 6/2017 |
| WO | WO 2017136833 | 8/2017 |
| WO | WO 9720244 | 12/2019 |
| WO | WO 2020/023383 | 1/2020 |

OTHER PUBLICATIONS

Response to Non-Final office action filed Sep. 12, 2016 for U.S. Appl. No. 14/641,376.
Final Office Action for U.S. Appl. No. 14/641,376 dated Nov. 14, 2016.
Response to Final Office action filed Mar. 14, 2017 for U.S. Appl. No. 14/641,376.
PCT International Search Report and Written Opinion for International Appln. No. PCT/US15/19339, Applicant Magic Leap, Inc., Forms PCT/ISA/210, 220, and 237, dated Jun. 24, 2015 (10 pages).
PCT International Search Report and Written Opinion for International Appln. No. PCT/US16/21095, Applicant Magic Leap, Inc., forms PCT/ISA/210, 220, and 237, dated May 31, 2016 (12 pages).
PCT International Search Report and Written Opinion for International Appln. No. PCT/US16/65001, Applicant Magic Leap, Inc., forms PCT/ISA/210, 220, and 237, dated Feb. 16, 2017 (16 pages).
PCT International Search Report and Written Opinion for International Appln. No. PCT/US2017/016722, Applicant Magic Leap, Inc., forms PCT/ISA/210, 220, and 237, dated Apr. 14, 2017 (24 pages).
Notice of Allowance dated Aug. 14, 2017 for U.S. Appl. No. 14/641,376.
Preliminary Amendment filed Aug. 24, 2017 for U.S. Appl. No. 15/425,837.
Non-Final Office Action dated Dec. 6, 2017 for U.S. Appl. No. 15/062,104.
Voluntary Amendment for Canadian Appln. No. 2979560 filed Oct. 6, 2017, 24 pages.
Voluntary Amendment for Japanese Appln. No. 2017-546703 filed Nov. 7, 2017, 7 pages.
Response to Non-Final office action filed Mar. 6, 2018 for U.S. Appl. No. 15/062,104.
Final Office Action filed Apr. 30, 2018 for U.S. Appl. No. 15/062,104.
Coiliot, C., Moutoussamy, J., Boda, M., and Leroy, P.: New ferromagnetic core shapes for induction sensors, J. Sens. Sens. Syst., 3,1-8, https://doi.org/10.5194/jsss-3-1-2014, 2014.
Non-Final Office Action dated Apr. 5, 2018 for U.S. Appl. No. 15/425,837.
Response to Non-Final Office Action filed Jul. 5, 2018 for U.S. Appl. No. 15/425,837.
Pre appeal brief filed Aug. 30, 2018 for U.S. Appl. No. 15/062,104.
Notice of Allowance dated Sep. 6 2018 for U.S. Appl. No. 15/425,837.
Extended European Search Report dated Oct. 16, 2018 for EP Application No. 16759643.6.
Amendment After Allowance dated Nov. 15, 2018 for U.S. Appl. No. 15/425,837.
Non final Office Action dated Nov. 29, 2018 for U.S. Appl. No. 15/369,646.
Amendment After Non-Final Office Action dated Feb. 28, 2019 for U.S. Appl. No. 15/369,646.
PCT International Search Report and Written Opinion for International Appln. No. PCT/US18/22884, Applicant Magic Leap, Inc., forms PCT/ISA/210, 220, and 237, dated May 21, 2018 (13 pages).
Non-Final Office Action for U.S. Appl. No. 15/923,560 dated Jan. 2, 2019.
Amendment Response to Non-Final Office Action for U.S. Appl. No. 15/923,560 dated Apr. 1, 2019.
PCT International Search Report and Written Opinion for International Appln. No. PCT/US18/22993, Applicant Magic Leap, Inc., forms PCT/ISA/210, 220, and 237, dated Jun. 8, 2018 (13 pages).
PCT Invitation to Pay Additional Fees for International Appln. No. PCT/US18/23011, Applicant Magic Leap, Inc. dated May 25, 2018 (18 pages).
PCT International Search Report and Written Opinion for International Appln. No. PCT/US18/23011, Applicant Magic Leap, Inc. dated Jul. 23, 2018 (18 pages).
Non-Final Office Action for U.S. Appl. No. 15/924,078 dated Mar. 21, 2019.
Reply brief filed May 6, 2019 for U.S. Appl. No. 15/062,104.
Response to Extended European Search Report dated May 13, 2019 for EP Application No. 16759643.6.
Extended European Search Report dated Jan. 7, 2019 for EP Application No. 16871733.8.
Song Yafei et al.: Fast Estimation of Relative Poses for 6-DOF Image Localization, 2015 IEEE International Conference on Multimedia Big Data, IEEE; Apr. 20, 2015, pp. 156-163, XP033173496.
Ng Joe Yue-Hei et al.: Exploiting local features from deep networks for image retrieval, 2015 IEEE Conference on Computer Vision and Pattern recognition workshops (CVPRW), IEEE; Jun. 7, 2015, pp. 53-61, XP032795533.

(56) References Cited

OTHER PUBLICATIONS

Bay Herbert et al.: SURF: Speeded Up Robust Features, International Conference on Simulation, Modeling and Programming for Autonomous Robots, Simpar 2010, Lecture Notes in Computer Science; Lect Notes Computer; May 7, 2006, pp. 404-417, XP047429677.
Alex Kendall et al.: PoseNet: A Convolutional Metwork for Real-Time 6-DOF Camera Relocalization,https://arxiv.org/pdf/1505.07427v3.pdf, Nov. 23, 2015; XP055536871.
Extended European Search Report dated Jan. 17, 2019 for EP Application No. 17748352.6.
Nair Rahul et al.: "A Survey on Time-of-Flight Stero Fusion", 9 Oct. 2015, Medical Image Computing and Computer Assisted Intervention—MICCAI 2015, 18th International Conference, Munich, Germany, Oct. 5-9, 2015; Proceedings; Lecture Notes in Computer Science; Lect Notes Computer; Springer International Publishing, CH, XP047148654.
Zhu J J et al.: Joint depth and alpha matte optimization via fusion of stero and time-of-flight sensor, 2009 IEEE Conference on Computer Vision and Pattern recognition (CVPR), IEEE; Jun. 20, 2009, pp. 453-460, XP002700137.
Non Final Office action dated Jun. 17, 2019 for U.S. Appl. No. 15/924,011.
Tian et al., View Synthesis Techniques for 3D Video, Proc. SPIE 7443, Applications of Digital Image Processing XXXII, 74430T, Sep. 2009 (Year: 2009).
Final Office Action dated Jun. 21, 2019 for U.S. Appl. No. 15/369,646.
Response to Non-Final Office Action filed Jun. 21, 2019 for U.S. Appl. No. 15/924,078.
Response to Restriction Requirement filed Jul. 22, 2019 for U.S. Appl. No. 15/877,359.
Final Office Action for U.S. Appl. No. 15/923,560 dated Jul. 11, 2019.
Non-Final Office Action for U.S. Appl. No. 15/665,335 dated Apr. 22, 2019.
Response to Non-Final Office Action for U.S. Appl. No. 15/665,335 dated Jul. 22, 2019.
Response to Restriction Requirement filed Mar. 18, 2019 for U.S. Appl. No. 15/665,335.
PCT International Search Report and Written Opinion for International Patent Appln. No. PCT/US2017/044762 dated Oct. 5, 2017 (8 pages).
Response to Extended European Search Report dated Jul. 30, 2019 for European Application No. 16871733.8, (12 pages).
Final Office Action for U.S. Appl. No. 15/924,078 dated Aug. 9, 2019.
Response to Final Office Action and AFCP for U.S. Appl. No. 15/369,646, filed Aug. 21, 2019.
Response Non Final Office action filed Sep. 12, 2019 for U.S. Appl. No. 15/924,011.
Advisory Action dated Sep. 6, 2019 for U.S. Appl. No. 15/369,646.
RCE and Response to Final Office Action for U.S. Appl. No. 15/369,646, filed Sep. 19, 2019.
Office Action for Chinese Appln. No. 201680025479.1 dated Jul. 23, 2019, 16 pages w/English translation.
Response to Final Office Action and AFCP for U.S. Appl. No. 15/924,078, filed Oct. 9, 2019.
Response to Final Office Action for U.S. Appl. No. 15/923,560, filed Oct. 10, 2019.
1st Examination Report dated Oct. 1, 2019 for European Application No. 16759643.6.
Non-Final Office Action dated Oct. 21, 2019 for U.S. Appl. No. 15/877,359.
Final office action dated Oct. 22, 2019 for U.S. Appl. No. 15/924,011.
Advisory Action dated Oct. 22, 2019 for U.S. Appl. No. 15/924,078.
Non-Final Office Action dated Oct. 31, 2019 for U.S. Appl. No. 15/923,560.
RCE and Response to Final Office Action filed Nov. 11, 2019 for U.S. Appl. No. 15/924,078.

Non Final Office Action dated Nov. 8, 2019 for U.S. Appl. No. 15/369,646.
Office Action for Israeli Appln. No. 254300 dated Oct. 27, 2019, 7 pages w/English translation.
Response to Office Action for Chinese Appln. No. 201680025479.1 filed Nov. 26, 2019, 9 pages w/English translation of claims.
Extended European Search Report dated Nov. 21, 2019 for European Application No. 18767086.4.
Extended European Search Report for European Appln. No. 17837488.0 dated Jul. 11, 2019 (10 pages).
Robert Earl Patterson, et al. "Low-Level Factors in Human Factors of Stereoscopic 3D Displays", ProQuest Ebook Central, Springer, London, Dec. 29, 2014. doi:10.1007/978-1-4471-6651-1_4, chapter 4.2; 4.3.
Jannick Rolland, et al. "The past, present and future of head-mounted display designs"; Nov. 8, 2004, Proc. SPIE 5638, p. 368.
RCE and Response to Final Office Action for U.S. Appl. No. 15/665,335, filed Dec. 4, 2019.
PCT International Search Report and Written Opinion for International Patent Appln. No. PCT/US2019/042819, dated Dec. 4, 2019 (12 pages).
PCT Invitation to Pay Additional Fees for International Patent Appln. No. PCT/US2019/042819, dated Sep. 18, 2019 (2 pages).
Lee, Y., et al., "Estimating Gaze Depth Using Multi-Layer Perceptron," Published by IEEE, retrived electronically on Apr. 12, 2019 (5 pages).
Extended European Search Report for European Appln. No. 18766694.6 dated Nov. 21, 2019 (9 pages).
Theohari S Theohari S et al. "The Magic of the Z-Buffer: A Survey", Journal of WSCG, Plzen, Czech Republic, Feb. 5, 2001, XP55640849.
Amir H. Behzadan et al: "Scalable 1-14 Algorithm for Resolving Incorrect Occlusion in Dynamic Augmented Reality Engineering Environments: Scalable algorithm for resolving incorrect occlusion", Computer-Aided Civil and Infrastructure Engineering, vol. 25, No. I, Jan. 1, 2010, pp. 3-19, XP55640847.
Breen D E et al: "Interactive occlusion 1-14 and automatic object placement for augmented reality", Computer Graphics Forum, Wiley-Blackwell Publishing Ltd, GB, vol. 15, No. 3, Aug. 26, 1996, pp. 11-22, XP002515919.
Mark WR et al: "Post-Rendering 3D 1-14 Warping", Proceedings of 1997 Symposium on Interactive 3 D Graphics Apr. 27-30, 1997 Providence, RI, USA; ACM, New York, NY, USA, Apr. 27 1997, pp. 7-16, XP000725355.
Amendment After Final Office Action for U.S. Appl. No. 15/924,011 dated Dec. 19, 2019.
Non-Final Office Action for U.S. Appl. No. 16/22,630 dated Dec. 26, 2019.
Non-Final Office Action for U.S. Appl. No. 15/924,078 dated Jan. 13, 2020.
Extended European Search Report for European Appln. No. 18742228.2 dated Jan. 13, 2020 (8 pages).
Amendment After non-final Office Action for U.S. Appl. No. 15/877,359 dated Jan. 21, 2020.
Notice of Allowance for U.S. Appl. No. 15/924,011 dated Jan. 23, 2020.
Response to Extended European Search Report for European Appln. No. 17837488.0 filed Jan. 28, 2020 (23 pages).
Amendment After non-final Office Action for U.S. Appl. No. 15/923,560 dated Jan. 31, 2020.
Amendment After non-final Office Action for U.S. Appl. No. 15/369,646 dated Feb. 10, 2020.
Response to Examination Report filed Feb. 11, 2020 for European Application No. 16759643.6.
Response to Office Action filed Feb. 20, 2020 for Israeli Patent Application No. 254300, (3 pages).
Amendment After non-final Office Action for U.S. Appl. No. 15/924,078 dated Apr. 13, 2020.
Notice of Allowance for U.S. Appl. No. 15/369,646 dated Apr. 8, 2020.
Final Office Action for U.S. Appl. No. 15/877,359 dated Apr. 16, 2020.
Amendment After non-final Office Action for U.S. Appl. No. 16/220,630 dated Apr. 27, 2020.

(56) References Cited

OTHER PUBLICATIONS

Foreign Office Action for Japanese Patent Appln. No. 2017-546703 dated Mar. 10, 2020.
Foreign Office Action for Israeli Patent Application No. 259766 dated Mar. 1, 2020.

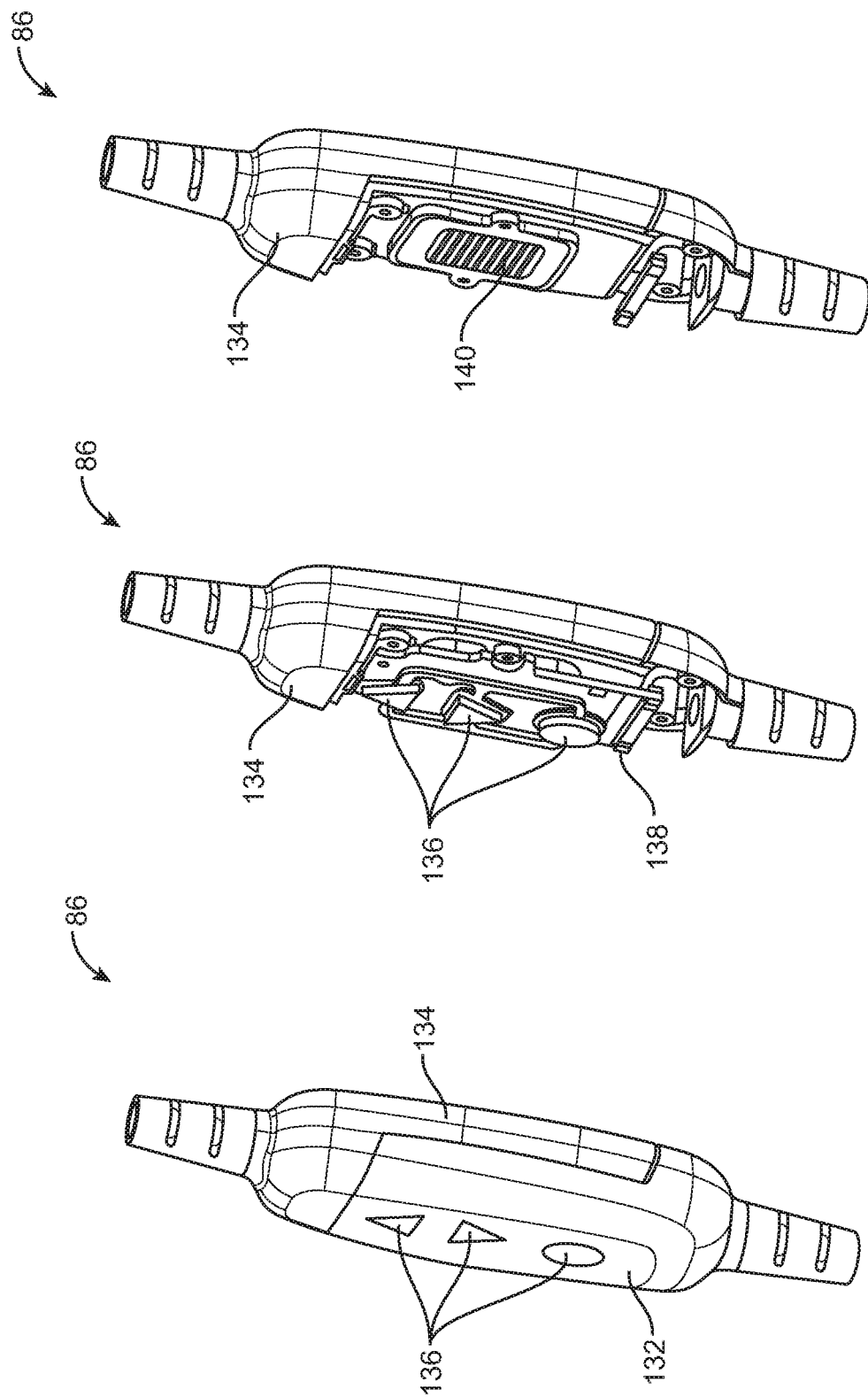

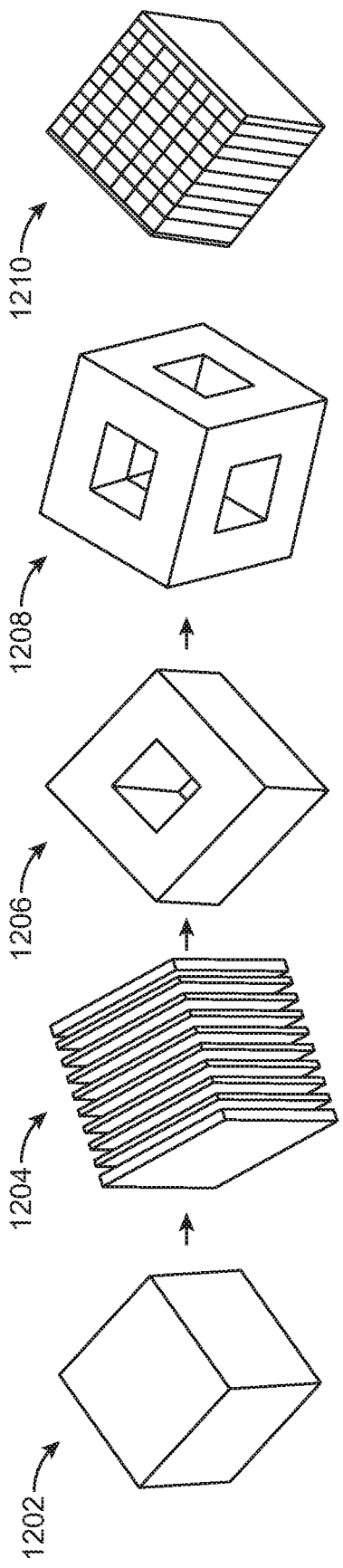

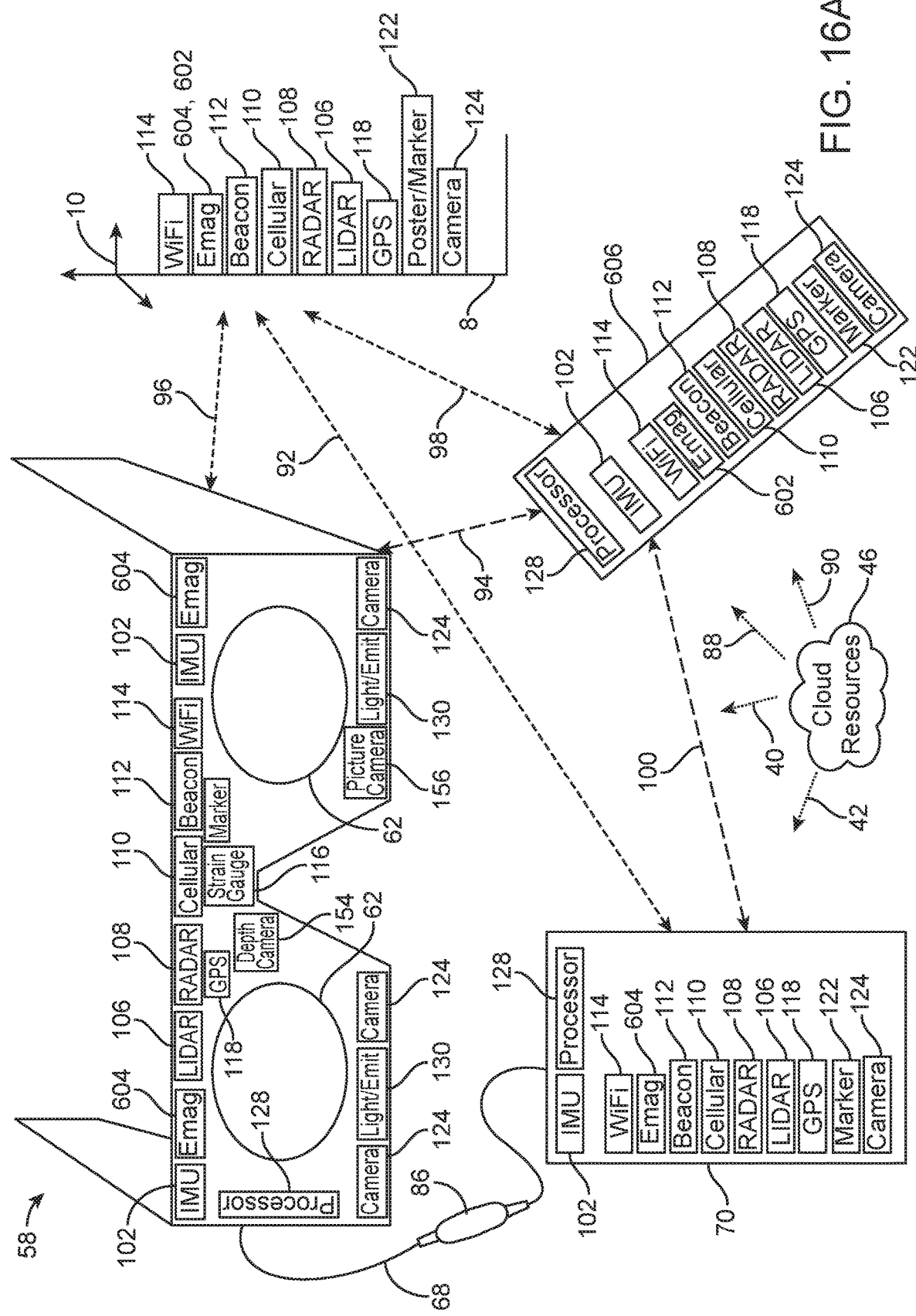

SYSTEMS AND METHODS FOR AUGMENTED REALITY

RELATED APPLICATIONS DATA

The present application is a continuation of pending U.S. application Ser. No. 15/425,837, filed Feb. 6, 2017 and entitled "SYSTEMS AND METHODS FOR AUGMENTED REALITY", which claims the benefit of priority to U.S. Provisional Patent Application Ser. Nos. 62/292,185, filed on Feb. 5, 2016 and entitled "SYSTEMS AND METHODS FOR AUGMENTED REALITY", filed on Feb. 23, 2016 and entitled "SYSTEMS AND METHODS FOR AUGMENTED REALITY". The Ser. No. 15/425,837 application is also a Continuation-in-Part of U.S. patent application Ser. No. 15/062,104, filed on Mar. 5, 2016 and entitled "SYSTEMS AND METHODS FOR AUGMENTED REALITY", which claims the benefit of priority to U.S. Provisional Patent Application Ser. Nos. 62/128,993, filed on Mar. 5, 2015 and entitled "ELECTROMAGNETIC TRACKING SYSTEM AND METHOD FOR AUGMENTED REALITY", and 62/292,185, filed on Feb. 5, 2016 and entitled "SYSTEMS AND METHODS FOR AUGMENTED REALITY". The present application is also related to U.S. Provisional Patent Application Ser. No. 62/301,847, filed on Mar. 1, 2016 and entitled "DEPTH SENSING SYSTEMS AND METHODS". The foregoing applications are hereby incorporated by reference into the present application in their entirety.

FIELD OF THE INVENTION

The present disclosure relates to systems and methods to localize position and orientation of one or more objects in the context of augmented reality systems.

BACKGROUND

Modern computing and display technologies have facilitated the development of systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to other actual real-world visual input; an augmented reality, or "AR", scenario typically involves presentation of digital or virtual image information as an augmentation to visualization of the actual world around the user.

For example, referring to FIG. 1, an augmented reality scene (4) is depicted wherein a user of an AR technology sees a real-world park-like setting (6) featuring people, trees, buildings in the background, and a concrete platform (1120). In addition to these items, the user of the AR technology also perceives that he "sees" a robot statue (1110) standing upon the real-world platform (1120), and a cartoon-like avatar character (2) flying by which seems to be a personification of a bumble bee, even though these elements (2, 1110) do not exist in the real world. As it turns out, the human visual perception system is very complex, and producing a VR or AR technology that facilitates a comfortable, natural-feeling, rich presentation of virtual image elements amongst other virtual or real-world imagery elements is challenging.

For instance, head-worn AR displays (or helmet-mounted displays, or smart glasses) typically are at least loosely coupled to a user's head, and thus move when the user's head moves. If the user's head motions are detected by the display system, the data being displayed can be updated to take the change in head pose into account.

As an example, if a user wearing a head-worn display views a virtual representation of a three-dimensional (3D) object on the display and walks around the area where the 3D object appears, that 3D object can be re-rendered for each viewpoint, giving the user the perception that he or she is walking around an object that occupies real space. If the head-worn display is used to present multiple objects within a virtual space (for instance, a rich virtual world), measurements of head pose (i.e., the location and orientation of the user's head) can be used to re-render the scene to match the user's dynamically changing head location and orientation and provide an increased sense of immersion in the virtual space.

In AR systems, detection or calculation of head pose can facilitate the display system to render virtual objects such that they appear to occupy a space in the real world in a manner that makes sense to the user. In addition, detection of the position and/or orientation of a real object, such as handheld device (which also may be referred to as a "totem"), haptic device, or other real physical object, in relation to the user's head or AR system may also facilitate the display system in presenting display information to the user to enable the user to interact with certain aspects of the AR system efficiently. As the user's head moves around in the real world, the virtual objects may be re-rendered as a function of head pose, such that the virtual objects appear to remain stable relative to the real world. At least for AR applications, placement of virtual objects in spatial relation to physical objects (e.g., presented to appear spatially proximate a physical object in two- or three-dimensions) may be a non-trivial problem. For example, head movement may significantly complicate placement of virtual objects in a view of an ambient environment. Such is true whether the view is captured as an image of the ambient environment and then projected or displayed to the end user, or whether the end user perceives the view of the ambient environment directly. For instance, head movement will likely cause a field of view of the end user to change, which will likely require an update to where various virtual objects are displayed in the field of the view of the end user. Additionally, head movements may occur within a large variety of ranges and speeds. Head movement speed may vary not only between different head movements, but within or across the range of a single head movement. For instance, head movement speed may initially increase (e.g., linearly or not) from a starting point, and may decrease as an ending point is reached, obtaining a maximum speed somewhere between the starting and ending points of the head movement. Rapid head movements may even exceed the ability of the particular display or projection technology to render images that appear uniform and/or as smooth motion to the end user.

Head tracking accuracy and latency (i.e., the elapsed time between when the user moves his or her head and the time when the image gets updated and displayed to the user) have been challenges for VR and AR systems. Especially for display systems that fill a substantial portion of the user's visual field with virtual elements, it is critical that the accuracy of head-tracking is high and that the overall system latency is very low from the first detection of head motion to the updating of the light that is delivered by the display to the user's visual system. If the latency is high, the system can create a mismatch between the user's vestibular and visual sensory systems, and generate a user perception scenario that can lead to motion sickness or simulator sickness. If the system latency is high, the apparent location of virtual objects will appear unstable during rapid head motions.

In addition to head-worn display systems, other display systems can benefit from accurate and low latency head pose detection. These include head-tracked display systems in which the display is not worn on the user's body, but is, e.g., mounted on a wall or other surface. The head-tracked display acts like a window onto a scene, and as a user moves his head relative to the "window" the scene is re-rendered to match the user's changing viewpoint. Other systems include a head-worn projection system, in which a head-worn display projects light onto the real world.

Additionally, in order to provide a realistic augmented reality experience, AR systems may be designed to be interactive with the user. For example, multiple users may play a ball game with a virtual ball and/or other virtual objects. One user may "catch" the virtual ball, and throw the ball back to another user. In another embodiment, a first user may be provided with a totem (e.g., a real bat communicatively coupled to the AR system) to hit the virtual ball. In other embodiments, a virtual user interface may be presented to the AR user to allow the user to select one of many options. The user may use totems, haptic devices, wearable components, or simply touch the virtual screen to interact with the system.

Detecting head pose and orientation of the user, and detecting a physical location of real objects in space enable the AR system to display virtual content in an effective and enjoyable manner. However, although these capabilities are key to an AR system, but are difficult to achieve. In other words, the AR system must recognize a physical location of a real object (e.g., user's head, totem, haptic device, wearable component, user's hand, etc.) and correlate the physical coordinates of the real object to virtual coordinates corresponding to one or more virtual objects being displayed to the user. This requires highly accurate sensors and sensor recognition systems that track a position and orientation of one or more objects at rapid rates. Current approaches do not perform localization at satisfactory speed or precision standards.

There, thus, is a need for a better localization system in the context of AR and VR devices.

SUMMARY

Embodiments of the present invention are directed to devices, systems and methods for facilitating virtual reality and/or augmented reality interaction for one or more users.

In one embodiment, an augmented reality (AR) display system includes an electromagnetic field emitter to emit a known magnetic field in a known coordinate system. The system also includes an electromagnetic sensor to measure a parameter related to a magnetic flux at the electromagnetic sensor resulting from the known magnetic field. The system further includes a depth sensor to measure a distance in the known coordinate system. Moreover, the system includes a controller to determine pose information of the electromagnetic sensor relative to the electromagnetic field emitter in the known coordinate system based at least in part on the parameter related to the magnetic flux measured by the electromagnetic sensor and the distance measured by the depth sensor. In addition, the system includes a display system to display virtual content to a user based at least in part on the pose information of the electromagnetic sensor relative to the electromagnetic field emitter.

In one or more embodiments, the depth sensor is a passive stereo depth sensor.

In one or more embodiments, the depth sensor is an active depth sensor. The depth sensor may be a texture projection stereo depth sensor, a structured light projection stereo depth sensor, a time of flight depth sensor, a LIDAR depth sensor, or a modulated emission depth sensor.

In one or more embodiments, the depth sensor includes a depth camera having a first field of view (FOV). The AR display system may also include a world capture camera, where the world capture camera has a second FOV at least partially overlapping with the first FOV. The AR display system may also include a picture camera, where the picture camera has a third FOV at least partially overlapping with the first FOV and the second FOV. The depth camera, the world capture camera, and the picture camera may have respective different first, second, and third resolutions. The first resolution of the depth camera may be sub-VGA, the second resolution of the world capture camera may be 720p, and the third resolution of the picture camera may be 2 megapixels.

In one or more embodiments, the depth camera, the world capture camera, and the picture camera are configured to capture respective first, second, and third images. The controller may be programmed to segment the second and third images. The controller may be programmed to fuse the second and third images after segmenting the second and third images to generate a fused image. Measuring a distance in the known coordinate system may include generating a hypothetical distance by analyzing the first image from the depth camera, and generating the distance by analyzing the hypothetical distance and the fused image. The depth camera, the world capture camera, and the picture camera may form a single integrated sensor.

In one or more embodiments, the AR display system also includes an additional localization resource to provide additional information. The pose information of the electromagnetic sensor relative to the electromagnetic field emitter in the known coordinate system may be determined based at least in part on the parameter related to the magnetic flux measured by the electromagnetic sensor, the distance measured by the depth sensor, and the additional information provided by the additional localization resource.

In one or more embodiments, the additional localization resource may include a WiFi transceiver, an additional electromagnetic emitter, or an additional electromagnetic sensor. The additional localization resource may include a beacon. The beacon may emit radiation. The radiation may be infrared radiation, and the beacon may include an infrared LED. The additional localization resource may include a reflector. The reflector may reflect radiation.

In one or more embodiments, the additional localization resource may include a cellular network transceiver, a RADAR emitter, a RADAR detector, a LIDAR emitter, a LIDAR detector, a GPS transceiver, a poster having a known detectable pattern, a marker having a known detectable pattern, an inertial measurement unit, or a strain gauge.

In one or more embodiments, the electromagnetic field emitter is coupled to a mobile component of the AR display system. The mobile component may be a hand-held component, a totem, a head-mounted component that houses the display system, a torso-worn component, or a belt-pack.

In one or more embodiments, the electromagnetic field emitter is coupled to an object in the known coordinate system, such that the electromagnetic field emitter has a known position and a known orientation. The electromagnetic sensor may be coupled to a mobile component of the AR display system. The mobile component may be a handheld component, a totem, a head-mounted component that houses the display system, a torso-worn component, or a belt-pack.

In one or more embodiments, the pose information includes a position and an orientation of the electromagnetic sensor relative to the electromagnetic field emitter in the known coordinate system. The controller may analyze the pose information to determine a position and an orientation of the electromagnetic sensor in the known coordinate system.

In another embodiment, a method for displaying augmented reality includes emitting, using an electromagnetic field emitter, a known magnetic field in a known coordinate system. The method also include measuring, using an electromagnetic sensor, a parameter related to a magnetic flux at the electromagnetic sensor resulting from the known magnetic field. The method further include measuring, using a depth sensor, a distance in the known coordinate system. Moreover, the method includes determining pose information of the electromagnetic sensor relative to the electromagnetic field emitter in the known coordinate system based at least in part on the parameter related to the magnetic flux measured using the electromagnetic sensor and the distance measured using the depth sensor. In addition, the method includes displaying virtual content to a user based at least in part on the pose information of the electromagnetic sensor relative to the electromagnetic field emitter.

In one or more embodiments, the depth sensor is a passive stereo depth sensor.

In one or more embodiments, the depth sensor is an active depth sensor. The depth sensor may be a texture projection stereo depth sensor, a structured light projection stereo depth sensor, a time of flight depth sensor, a LIDAR depth sensor, or a modulated emission depth sensor.

In one or more embodiments, the depth sensor includes a depth camera having a first field of view (FOV). The depth sensor may also include a world capture camera, where the world capture camera has a second FOV at least partially overlapping with the first FOV. The depth sensor may also include a picture camera, where the picture camera has a third FOV at least partially overlapping with the first FOV and the second FOV. The depth camera, the world capture camera, and the picture camera may have respective different first, second, and third resolutions. The first resolution of the depth camera may be sub-VGA, the second resolution of the world capture camera may be 720p, and the third resolution of the picture camera may be 2 megapixels.

In one or more embodiments, method also includes capturing first, second, and third images using respective depth camera, world capture camera, and picture camera. The method may also include segmenting the second and third images. The method may further include fusing the second and third images after segmenting the second and third images to generate a fused image. Measuring a distance in the known coordinate system may include generating a hypothetical distance by analyzing the first image from the depth camera, and generating the distance by analyzing the hypothetical distance and the fused image. The depth camera, the world capture camera, and the picture camera may form a single integrated sensor.

In one or more embodiments, the method also includes determining the pose information of the electromagnetic sensor relative to the electromagnetic field emitter in the known coordinate system based at least in part on the parameter related to the magnetic flux measured using the electromagnetic sensor, the distance measured using the depth sensor, and additional information provided by an additional localization resource.

In one or more embodiments, the additional localization resource may include a WiFi transceiver, an additional electromagnetic emitter, or an additional electromagnetic sensor. The additional localization resource may include a beacon. The method may also include the beacon emitting radiation. The radiation may be infrared radiation, and the beacon may include an infrared LED. The additional localization resource may include a reflector. The method may also include the reflector reflecting radiation.

In one or more embodiments, the additional localization resource may include a cellular network transceiver, a RADAR emitter, a RADAR detector, a LIDAR emitter, a LIDAR detector, a GPS transceiver, a poster having a known detectable pattern, a marker having a known detectable pattern, an inertial measurement unit, or a strain gauge.

In one or more embodiments, the electromagnetic field emitter is coupled to a mobile component of an AR display system. The mobile component may be a hand-held component, a totem, a head-mounted component that houses the display system, a torso-worn component, or a belt-pack.

In one or more embodiments, the electromagnetic field emitter is coupled to an object in the known coordinate system, such that the electromagnetic field emitter has a known position and a known orientation. The electromagnetic sensor may be coupled to a mobile component of an AR display system. The mobile component may be a hand-held component, a totem, a head-mounted component that houses the display system, a torso-worn component, or a belt-pack.

In one or more embodiments, the pose information includes a position and an orientation of the electromagnetic sensor relative to the electromagnetic field emitter in the known coordinate system. The method may also include analyzing the pose information to determine a position and an orientation of the electromagnetic sensor in the known coordinate system.

In still another embodiment, an augmented reality display system includes a hand-held component coupled to an electromagnetic field emitter, the electromagnetic field emitter emitting a magnetic field. The system also includes a head-mounted component having a display system that displays virtual content to a user. The head mounted component is coupled to an electromagnetic sensor measuring a parameter related to a magnetic flux at the electromagnetic sensor resulting from the magnetic field, where a head pose of the head-mounted component in a known coordinate system is known. The system further includes a depth sensor measuring a distance in the known coordinate system. Moreover, the system includes a controller communicatively coupled to the hand-held component, the head-mounted component, and the depth sensor. The controller receives the parameter related to the magnetic flux at the electromagnetic sensor from the head mounted component and the distance from the depth sensor. The controller determines a hand pose of the hand-held component based at least in part on the parameter related to the magnetic flux measured by the electromagnetic sensor and the distance measured by the depth sensor. The system modifies the virtual content displayed to the user based at least in part on the hand pose.

In one or more embodiments, the depth sensor is a passive stereo depth sensor.

In one or more embodiments, the depth sensor is an active depth sensor. The depth sensor may be a texture projection stereo depth sensor, a structured light projection stereo depth sensor, a time of flight depth sensor, a LIDAR depth sensor, or a modulated emission depth sensor.

In one or more embodiments, the depth sensor includes a depth camera having a first field of view (FOV). The AR display system may also include a world capture camera, where the world capture camera has a second FOV at least partially overlapping with the first FOV. The AR display system may also include a picture camera, where the picture camera has a third FOV at least partially overlapping with the first FOV and the second FOV. The depth camera, the world capture camera, and the picture camera may have respective different first, second, and third resolutions. The first resolution of the depth camera may be sub-VGA, the second resolution of the world capture camera may be 720p, and the third resolution of the picture camera may be 2 megapixels.

In one or more embodiments, the depth camera, the world capture camera, and the picture camera are configured to capture respective first, second, and third images. The controller may be programmed to segment the second and third images. The controller may be programmed to fuse the second and third images after segmenting the second and third images to generate a fused image. Measuring a distance in the known coordinate system may include generating a hypothetical distance by analyzing the first image from the depth camera, and generating the distance by analyzing the hypothetical distance and the fused image. The depth camera, the world capture camera, and the picture camera may form a single integrated sensor.

In one or more embodiments, the AR display system also includes an additional localization resource to provide additional information. The controller determines the hand pose of the hand-held component based at least in part on the parameter related to the magnetic flux measured by the electromagnetic sensor, the distance measured by the depth sensor, and the additional information provided by the additional localization resource.

In one or more embodiments, the additional localization resource may include a WiFi transceiver, an additional electromagnetic emitter, or an additional electromagnetic sensor. The additional localization resource may include a beacon. The beacon may emit radiation. The radiation may be infrared radiation, and the beacon may include an infrared LED. The additional localization resource may include a reflector. The reflector may reflect radiation.

In one or more embodiments, the additional localization resource may include a cellular network transceiver, a RADAR emitter, a RADAR detector, a LIDAR emitter, a LIDAR detector, a GPS transceiver, a poster having a known detectable pattern, a marker having a known detectable pattern, an inertial measurement unit, or a strain gauge.

In one or more embodiments, the electromagnetic field hand-held component is a totem. The hand pose information may include a position and an orientation of the hand-held component in the known coordinate system.

Additional and other objects, features, and advantages of the invention are described in the detail description, figures and claims.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 9A-9F illustrate various embodiments of control and quick release modules.

FIGS. 12A-12E illustrate various embodiments of ferrite cubes to be coupled to electromagnetic sensors.

FIG. 16A illustrates a schematic view of various components of an AR system according to another embodiment having a depth sensor, an electromagnetic transmitter and an electromagnetic sensor.

DETAILED DESCRIPTION

Referring to FIGS. 2A-2D, some general componentry options are illustrated. In the portions of the detailed description which follow the discussion of FIGS. 2A-2D, various systems, subsystems, and components are presented for addressing the objectives of providing a high-quality, comfortably-perceived display system for human VR and/or AR.

Figure 2A:
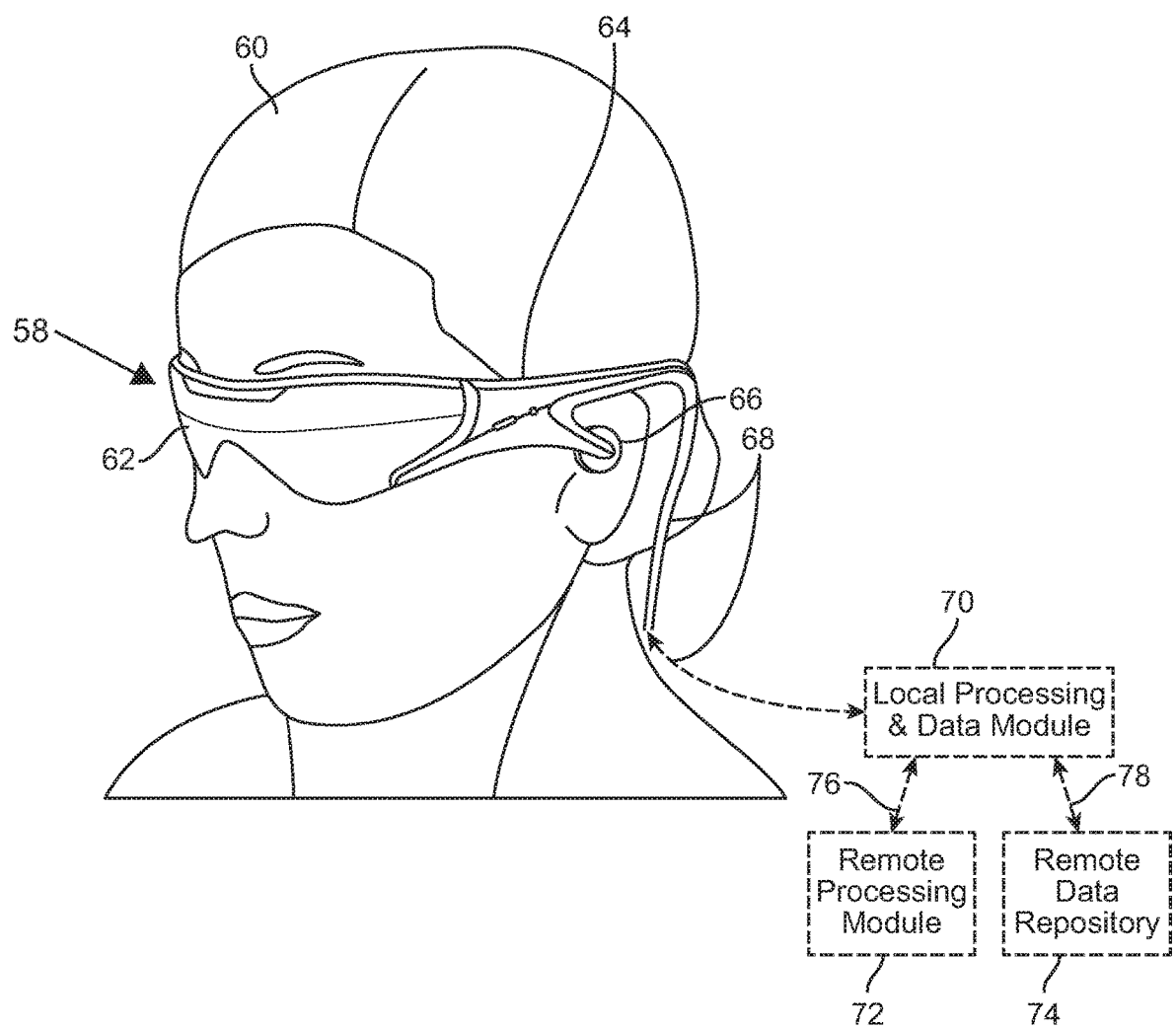
FIGS. 2A-2D illustrate various embodiments of wearable AR devices
Figure 2B:
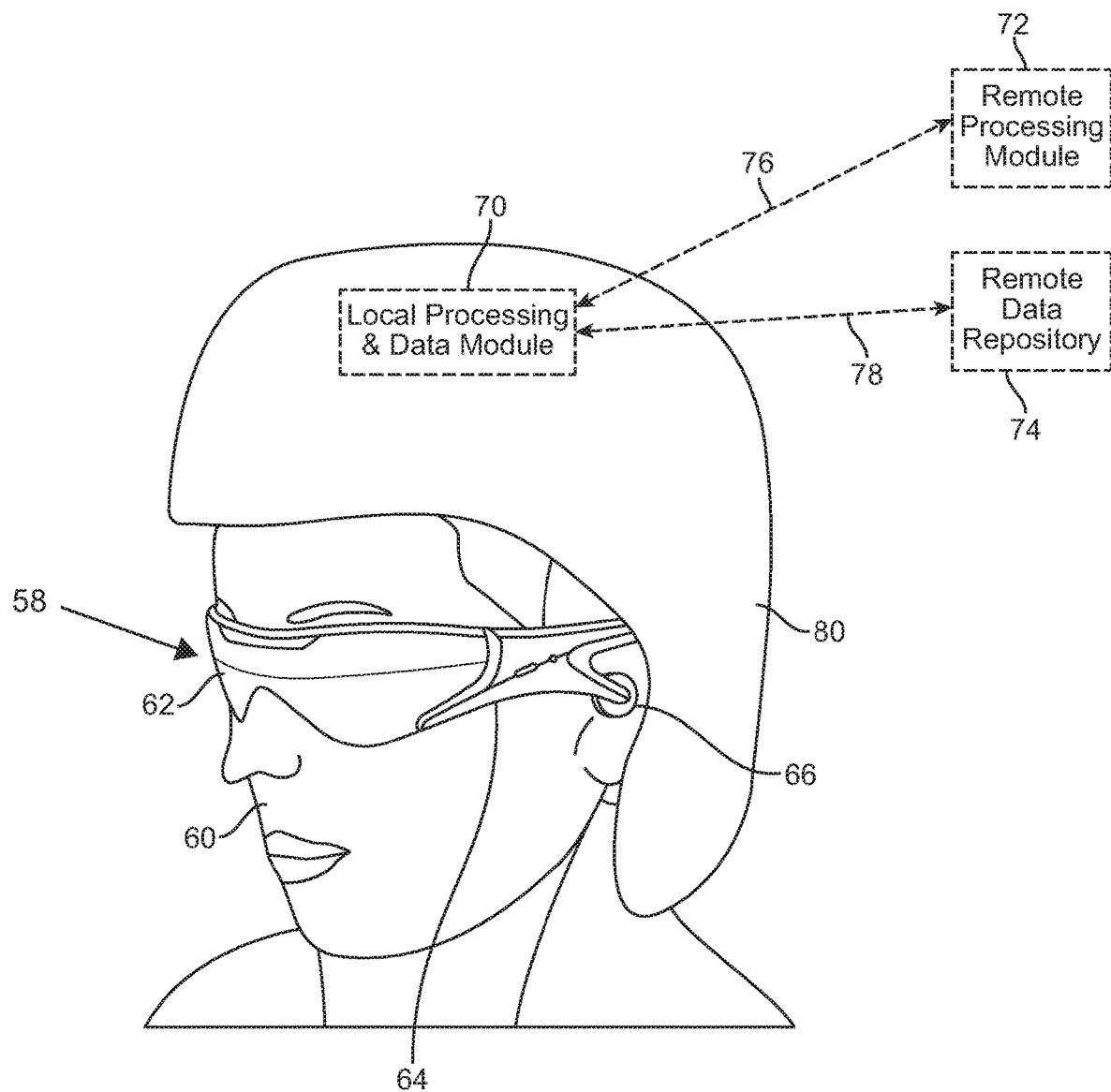
Figure 2C:
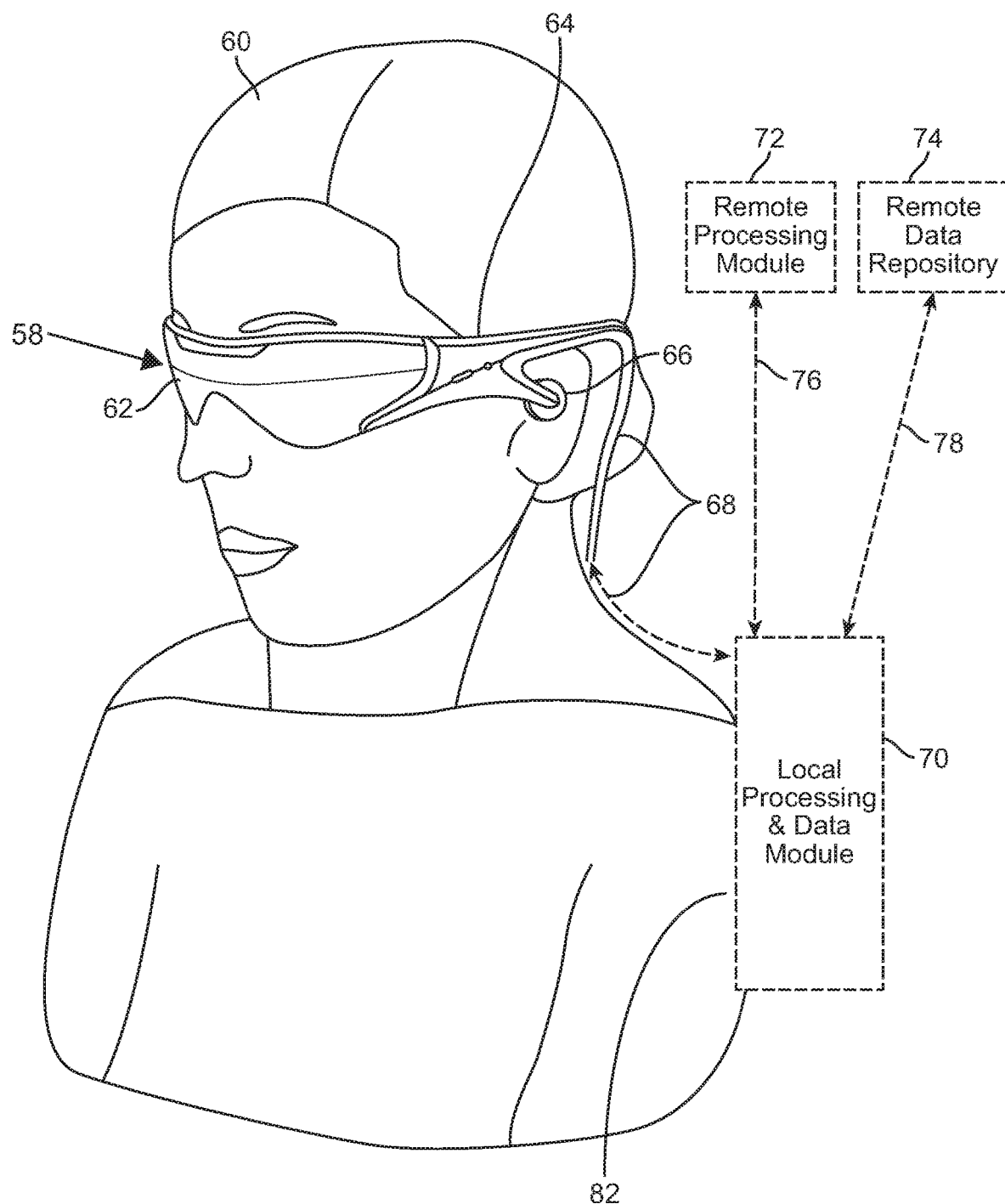
Figure 2D:
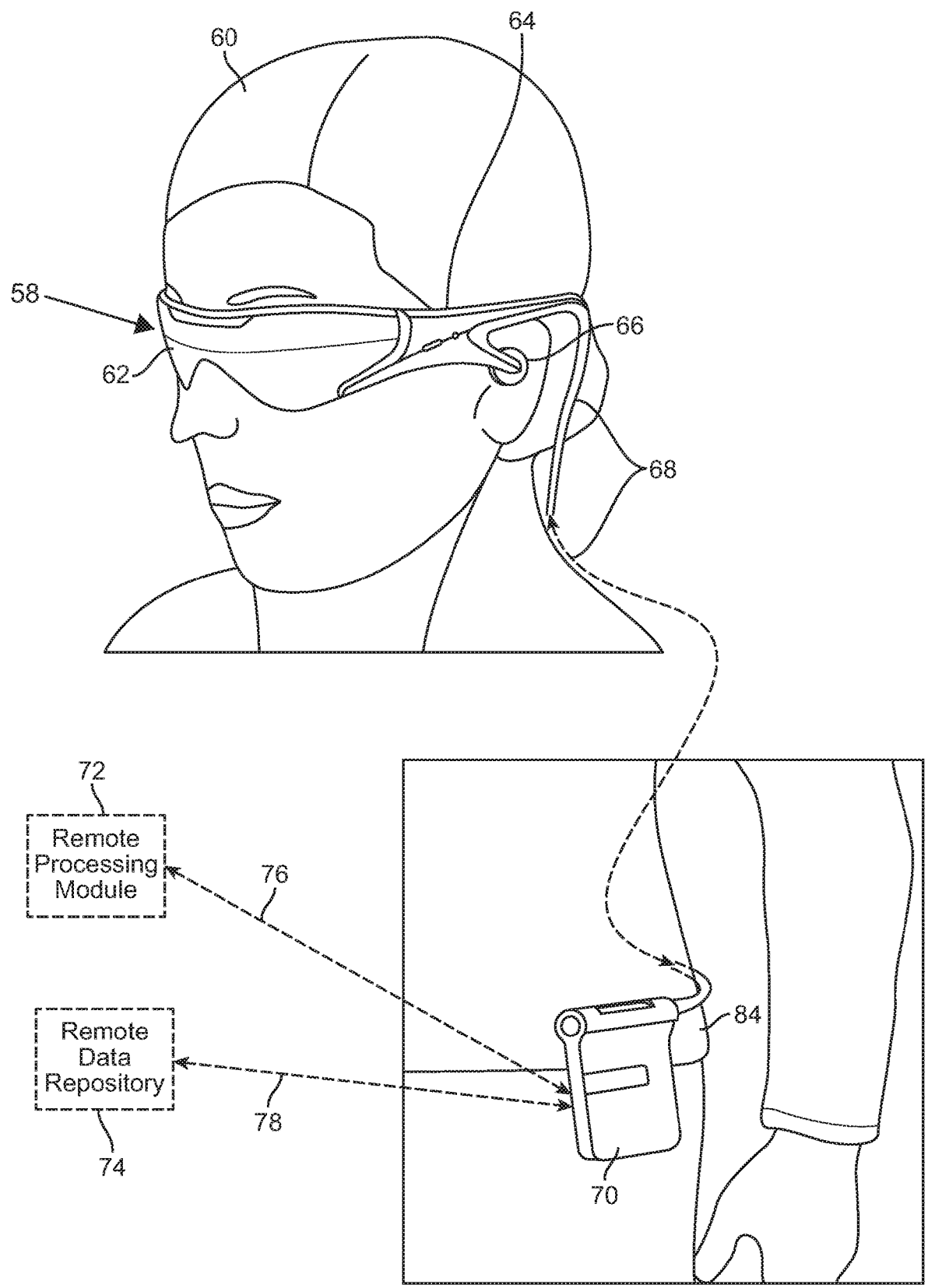

As shown in FIG. 2A, an AR system user (60) is depicted wearing head mounted component (58) featuring a frame (64) structure coupled to a display system (62) positioned in front of the eyes of the user. A speaker (66) is coupled to the frame (64) in the depicted configuration and positioned adjacent the ear canal of the user (in one embodiment, another speaker, not shown, is positioned adjacent the other ear canal of the user to provide for stereo/shapeable sound control). The display (62) is operatively coupled (68), such as by a wired lead or wireless connectivity, to a local processing and data module (70) which may be mounted in a variety of configurations, such as fixedly attached to the frame (64), fixedly attached to a helmet or hat (80) as shown in the embodiment of FIG. 2B, embedded in headphones, removably attached to the torso (82) of the user (60) in a backpack-style configuration as shown in the embodiment of FIG. 2C, or removably attached to the hip (84) of the user (60) in a belt-coupling style configuration as shown in the embodiment of FIG. 2D.

The local processing and data module (70) may comprise a power-efficient processor or controller, as well as digital memory, such as flash memory, both of which may be utilized to assist in the processing, caching, and storage of data a) captured from sensors which may be operatively coupled to the frame (64), such as image capture devices (such as cameras), microphones, inertial measurement units, accelerometers, compasses, GPS units, radio devices, and/or gyros; and/or b) acquired and/or processed using the remote processing module (72) and/or remote data repository (74), possibly for passage to the display (62) after such processing or retrieval. The local processing and data module (70) may be operatively coupled (76, 78), such as via a wired or wireless communication links, to the remote processing module (72) and remote data repository (74) such that these remote modules (72, 74) are operatively coupled to each other and available as resources to the local processing and data module (70).

In one embodiment, the remote processing module (72) may comprise one or more relatively powerful processors or controllers configured to analyze and process data and/or image information. In one embodiment, the remote data repository (74) may comprise a relatively large-scale digital data storage facility, which may be available through the internet or other networking configuration in a "cloud" resource configuration. In one embodiment, all data is stored and all computation is performed in the local processing and data module, allowing fully autonomous use from any remote modules.

Figure 3:
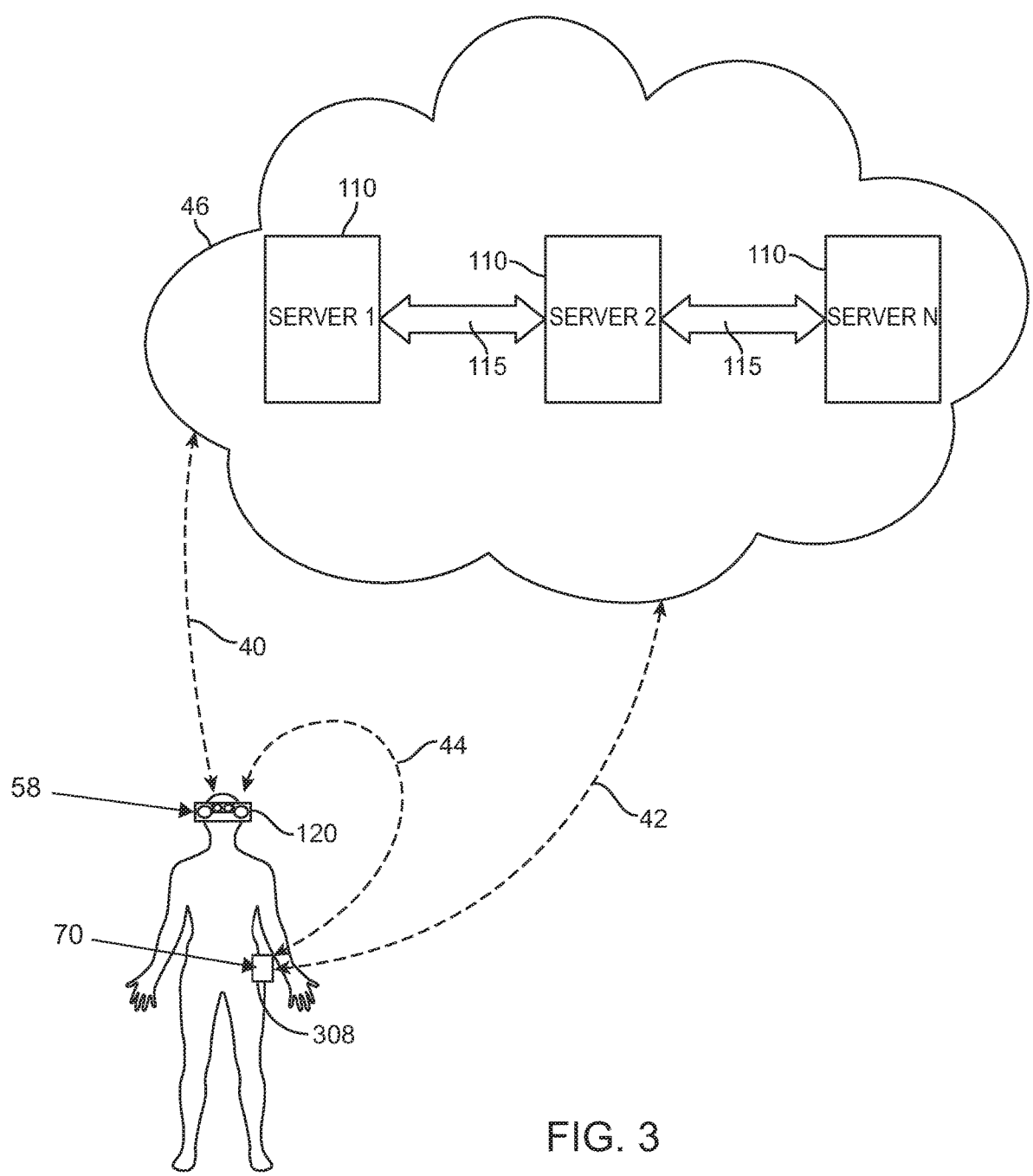
FIG. 3 illustrates an example embodiment of a wearable AR device interacting with one or more cloud servers of the AR system.

Referring now to FIG. 3, a schematic illustrates coordination between the cloud computing assets (46) and local processing assets, which may, for example reside in head mounted componentry (58) coupled to the user's head (120) and a local processing and data module (70), coupled to the user's belt (308; therefore the component 70 may also be termed a "belt pack" 70), as shown in FIG. 3. In one embodiment, the cloud (46) assets, such as one or more server systems (110) are operatively coupled (115), such as via wired or wireless networking (wireless being preferred for mobility, wired being preferred for certain high-bandwidth or high-data-volume transfers that may be desired), directly to (40, 42) one or both of the local computing assets, such as processor and memory configurations, coupled to the user's head (120) and belt (308) as described above. These computing assets local to the user may be operatively coupled to each other as well, via wired and/or wireless connectivity configurations (44), such as the wired coupling (68) discussed below in reference to FIG. 8. In one embodiment, to maintain a low-inertia and small-size subsystem mounted to the user's head (120), primary transfer between the user and the cloud (46) may be via the link between the subsystem mounted at the belt (308) and the cloud, with the head mounted (120) subsystem primarily data-tethered to the belt-based (308) subsystem using wireless connectivity, such as ultra-wideband ("UWB") connectivity, as is currently employed, for example, in personal computing peripheral connectivity applications.

With efficient local and remote processing coordination, and an appropriate display device for a user, such as the user interface or user display system (62) shown in FIG. 2A, or variations thereof, aspects of one world pertinent to a user's current actual or virtual location may be transferred or "passed" to the user and updated in an efficient fashion. In other words, a map of the world may be continually updated at a storage location which may partially reside on the user's AR system and partially reside in the cloud resources. The map (also referred to as a "passable world model") may be a large database comprising raster imagery, 3-D and 2-D points, parametric information and other information about the real world. As more and more AR users continually capture information about their real environment (e.g., through cameras, sensors, IMUs, etc.), the map becomes more and more accurate and complete.

Figure 1:
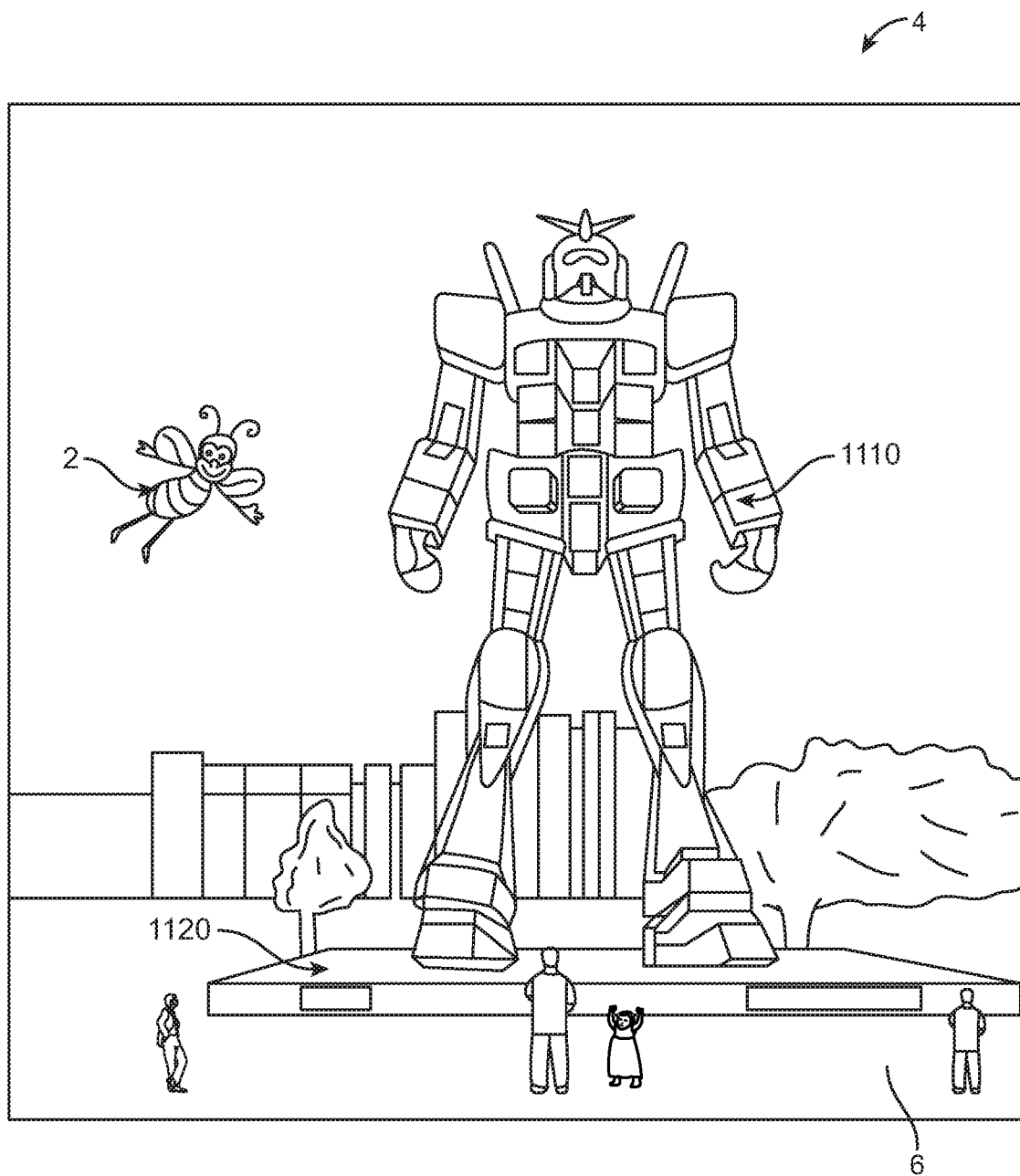
FIG. 1 illustrates a plan view of an AR scene displayed to a user of an AR system according to one embodiment.

With a configuration as described above, wherein there is one world model that can reside on cloud computing resources and be distributed from there, such world can be "passable" to one or more users in a relatively low bandwidth form preferable to trying to pass around real-time video data or the like. The augmented experience of the person standing near the statue (i.e., as shown in FIG. 1) may be informed by the cloud-based world model, a subset of which may be passed down to them and their local display device to complete the view. A person sitting at a remote display device, which may be as simple as a personal computer sitting on a desk, can efficiently download that same section of information from the cloud and have it rendered on their display. Indeed, one person actually present in the park near the statue may take a remotely-located friend for a walk in that park, with the friend joining through virtual and augmented reality. The system will need to know where the street is, wherein the trees are, where the statue is—but with that information on the cloud, the joining friend can download from the cloud aspects of the scenario, and then start walking along as an augmented reality local relative to the person who is actually in the park.

3-D points may be captured from the environment, and the pose (i.e., vector and/or origin position information relative to the world) of the cameras that capture those images or points may be determined, so that these points or images may be "tagged", or associated, with this pose information. Then points captured by a second camera may be utilized to determine the pose of the second camera. In other words, one can orient and/or localize a second camera based upon comparisons with tagged images from a first camera. Then this knowledge may be utilized to extract textures, make maps, and create a virtual copy of the real world (because then there are two cameras around that are registered).

So at the base level, in one embodiment a person-worn system can be utilized to capture both 3-D points and the 2-D images that produced the points, and these points and images may be sent out to a cloud storage and processing resource. They may also be cached locally with embedded pose information (i.e., cache the tagged images); so the cloud may have on the ready (i.e., in available cache) tagged 2-D images (i.e., tagged with a 3-D pose), along with 3-D points. If a user is observing something dynamic, he may also send additional information up to the cloud pertinent to the motion (for example, if looking at another person's face, the user can take a texture map of the face and push that up at an optimized frequency even though the surrounding world is otherwise basically static). More information on object recognizers and the passable world model may be found in U.S. patent application Ser. No. 14/205,126, entitled "System and method for augmented and virtual reality", which is incorporated by reference in its entirety herein, along with the following additional disclosures, which related to augmented and virtual reality systems such as those developed by Magic Leap, Inc. of Fort Lauderdale, Fla.: U.S. patent application Ser. No. 14/641,376; U.S. patent application Ser. No. 14/555,585; U.S. patent application Ser. No. 14/212,961; U.S. patent application Ser. No. 14/690,401; U.S. patent application Ser. No. 13/663,466; and U.S. patent application Ser. No. 13/684,489.

In order to capture points that can be used to create the "passable world model," it is helpful to accurately know the user's location, pose and orientation with respect to the world. More particularly, the user's position must be localized to a granular degree, because it may be important to know the user's head pose, as well as hand pose (if the user is clutching a handheld component, gesturing, etc.). In one or more embodiments, GPS and other localization information may be utilized as inputs to such processing. Highly accurate localization of the user's head, totems, hand gestures, haptic devices etc. are crucial in displaying appropriate virtual content to the user.

One approach to achieve high precision localization may involve the use of an electromagnetic field coupled with electromagnetic sensors that are strategically placed on the user's AR head set, belt pack, and/or other ancillary devices (e.g., totems, haptic devices, gaming instruments, etc.). Electromagnetic tracking systems typically comprise at least an electromagnetic field emitter and at least one electromagnetic field sensor. The sensors may measure electromagnetic fields with a known distribution. Based on these measurements a position and orientation of a field sensor relative to the emitter is determined.

Figure 4:
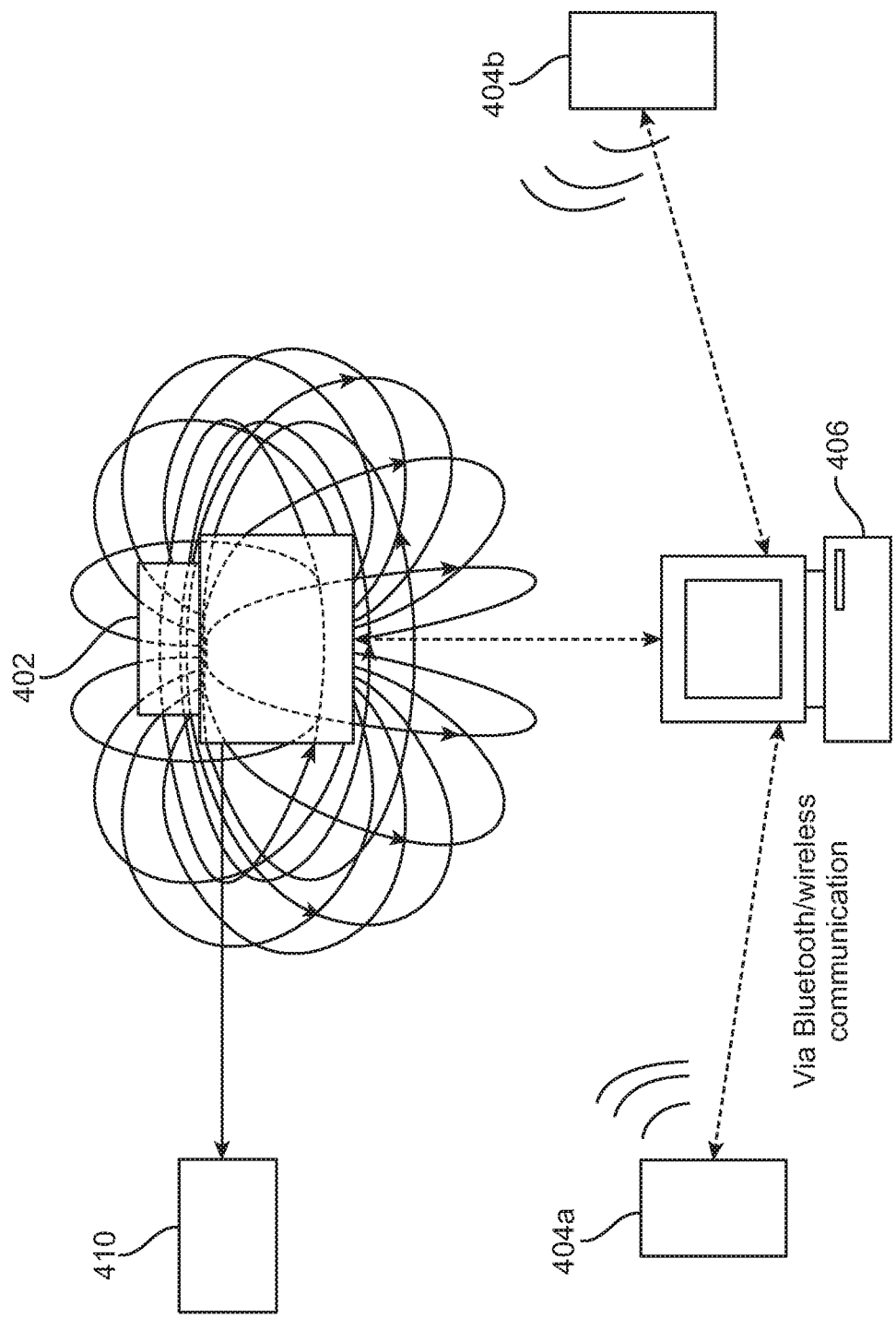
FIG. 4 illustrates an example embodiment of an electromagnetic tracking system.

Referring now to FIG. 4, an example system diagram of an electromagnetic tracking system (e.g., such as those developed by organizations such as the Biosense® division of Johnson & Johnson Corporation, Polhemus®, Inc. of Colchester, Vt., manufactured by Sixense® Entertainment, Inc. of Los Gatos, Calif., and other tracking companies) is illustrated. In one or more embodiments, the electromagnetic tracking system comprises an electromagnetic field emitter 402 which is configured to emit a known magnetic field. As shown in FIG. 4, the electromagnetic field emitter may be coupled to a power supply (e.g., electric current, batteries, etc.) to provide power to the emitter 402.

In one or more embodiments, the electromagnetic field emitter 402 comprises several coils (e.g., at least three coils positioned perpendicular to each other to produce field in the x, y and z directions) that generate magnetic fields. This magnetic field is used to establish a coordinate space. This allows the system to map a position of the sensors in relation to the known magnetic field, and helps determine a position and/or orientation of the sensors. In one or more embodiments, the electromagnetic sensors 404*a*, 404*b*, etc. may be attached to one or more real objects. The electromagnetic sensors 404 may comprise smaller coils in which current may be induced through the emitted electromagnetic field. Generally the "sensor" components (404) may comprise small coils or loops, such as a set of three differently-oriented (i.e., such as orthogonally oriented relative to each other) coils coupled together within a small structure such as a cube or other container, that are positioned/oriented to capture incoming magnetic flux from the magnetic field emitted by the emitter (402), and by comparing currents induced through these coils, and knowing the relative positioning and orientation of the coils relative to each other, relative position and orientation of a sensor relative to the emitter may be calculated.

One or more parameters pertaining to a behavior of the coils and inertial measurement unit ("IMU") components operatively coupled to the electromagnetic tracking sensors may be measured to detect a position and/or orientation of the sensor (and the object to which it is attached to) relative to a coordinate system to which the electromagnetic field emitter is coupled. Of course this coordinate system may be translated into a world coordinate system, in order to determine a location or pose of the electromagnetic field emitter in the real world. In one or more embodiments, multiple sensors may be used in relation to the electromagnetic emitter to detect a position and orientation of each of the sensors within the coordinate space.

It should be appreciated that in some embodiments, head pose may already be known based on sensors on the head-mounted component of the AR system, and SLAM analysis performed based on sensor data and image data captured through the headmounted AR system. However, it may be important to know a position of the user's hand (e.g., a handheld component like a totem, etc.) relative to the known head pose. In other words, it may be important to know a hand pose relative to the head pose. Once the relationship between the head (assuming the sensors are placed on the headmounted component) and hand is known, a location of the hand relative to the world (e.g., world coordinates) can be easily calculated.

Figure 6:
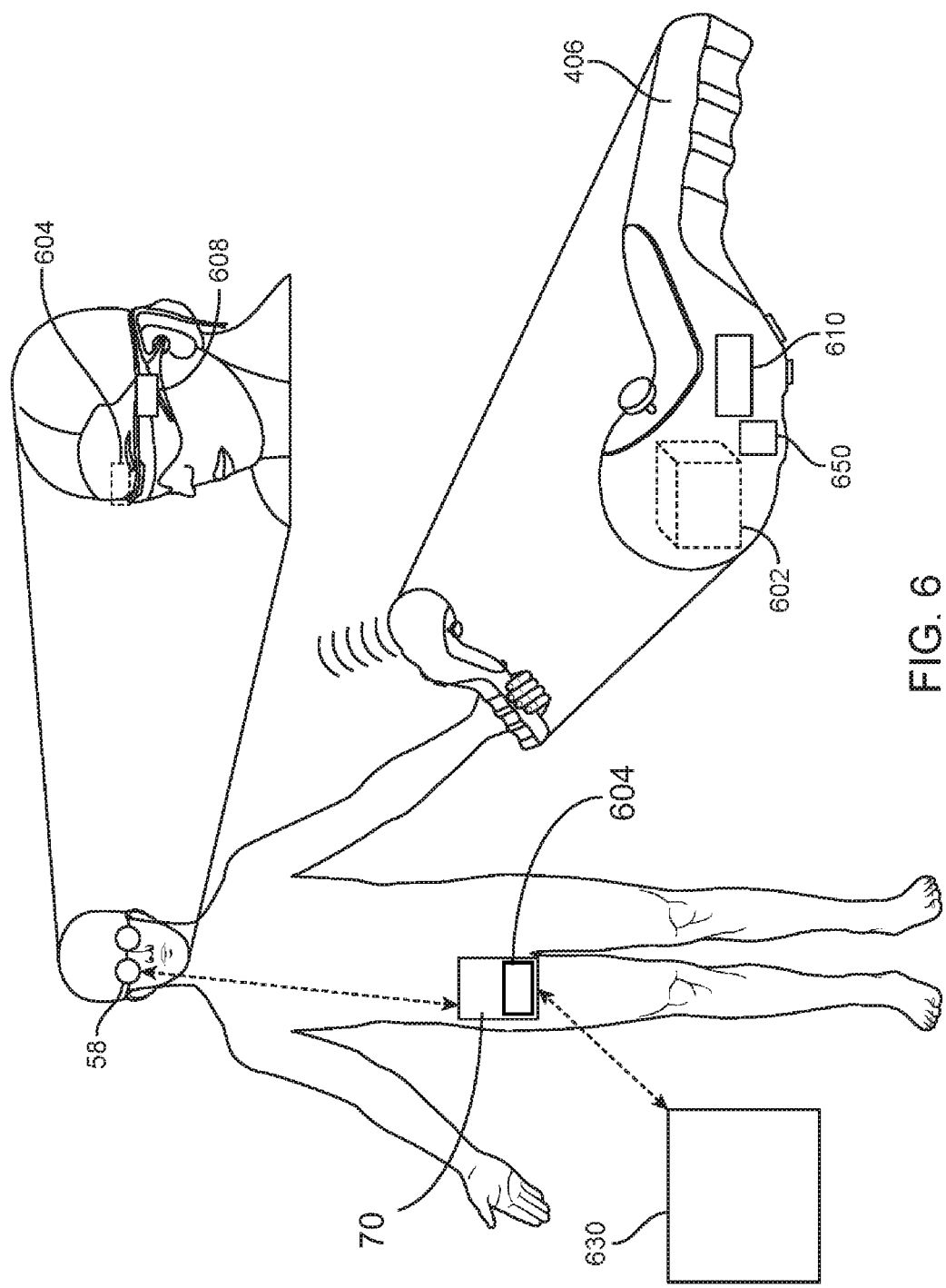
FIG. 6 illustrates an example embodiment of as AR system having an electromagnetic tracking system.

The electromagnetic tracking system may provide positions in three directions (i.e., X, Y and Z directions), and further in two or three orientation angles. In one or more embodiments, measurements of the IMU may be compared to the measurements of the coil to determine a position and orientation of the sensors. In one or more embodiments, both electromagnetic (EM) data and IMU data, along with various other sources of data, such as cameras, depth sensors, and other sensors, may be combined to determine the position and orientation. This information may be transmitted (e.g., wireless communication, Bluetooth, etc.) to the controller 406. In one or more embodiments, pose (or position and orientation) may be reported at a relatively high refresh rate in conventional systems. Conventionally an electromagnetic emitter is coupled to a relatively stable and large object, such as a table, operating table, wall, or ceiling, and one or more sensors are coupled to smaller objects, such as medical devices, handheld gaming components, or the like. Alternatively, as described below in reference to FIG. 6, various features of the electromagnetic tracking system may be employed to produce a configuration wherein changes or deltas in position and/or orientation between two objects that move in space relative to a more stable global coordinate system may be tracked; in other words, a configuration is shown in FIG. 6 wherein a variation of an electromagnetic tracking system may be utilized to track position and orientation delta between a head-mounted component and a hand-held component, while head pose relative to the global coordinate system (say of the room environment local to the user) is determined otherwise, such as by simultaneous localization and mapping ("SLAM") techniques using outward-capturing cameras which may be coupled to the head mounted component of the system.

The controller 406 may control the electromagnetic field generator 402, and may also capture data from the various electromagnetic sensors 404. It should be appreciated that the various components of the system may be coupled to each other through any electro-mechanical or wireless/ Bluetooth means. The controller 406 may also comprise data regarding the known magnetic field, and the coordinate space in relation to the magnetic field. This information is then used to detect the position and orientation of the sensors in relation to the coordinate space corresponding to the known electromagnetic field.

One advantage of electromagnetic tracking systems is that they produce highly accurate tracking results with minimal latency and high resolution. Additionally, the electromagnetic tracking system does not necessarily rely on optical trackers, and sensors/objects not in the user's line-of-vision may be easily tracked.

It should be appreciated that the strength of the electromagnetic field v drops as a cubic function of distance r from a coil transmitter (e.g., electromagnetic field emitter 402). Thus, an algorithm may be required based on a distance away from the electromagnetic field emitter. The controller 406 may be configured with such algorithms to determine a position and orientation of the sensor/object at varying distances away from the electromagnetic field emitter. Given the rapid decline of the strength of the electromagnetic field as one moves farther away from the electromagnetic emitter, best results, in terms of accuracy, efficiency and low latency, may be achieved at closer distances. In typical electromagnetic tracking systems, the electromagnetic field emitter is powered by electric current (e.g., plug-in power supply) and has sensors located within 20 ft radius away from the electromagnetic field emitter. A shorter radius between the sensors and field emitter may be more desirable in many applications, including AR applications.

Figure 5:
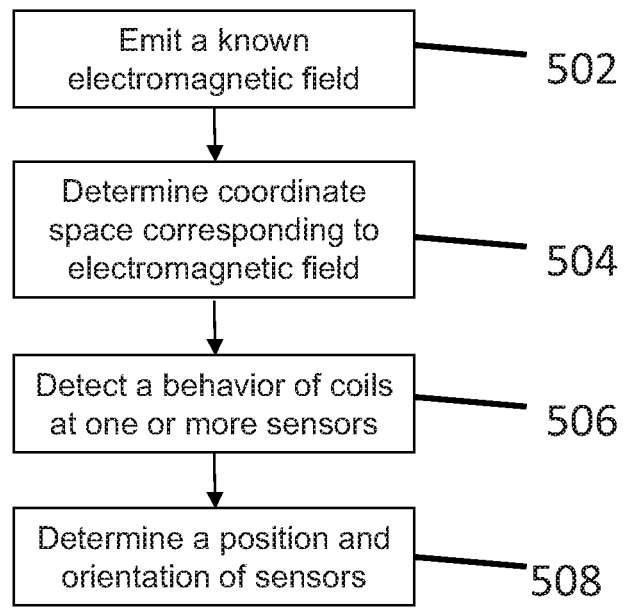
FIG. 5 illustrates an example method of determining a position and orientation of sensors, according to one example embodiment.

Referring now to FIG. 5, an example flowchart describing a functioning of a typical electromagnetic tracking system is briefly described. At 502, a known electromagnetic field is emitted. In one or more embodiments, the magnetic field emitter may generate magnetic fields, and each coil may generate an electric field in one direction (e.g., x, y or z). The magnetic fields may be generated with an arbitrary waveform. In one or more embodiments, each of the axes may oscillate at a slightly different frequency. At 504, a coordinate space corresponding to the electromagnetic field may be determined. For example, the controller 406 of FIG. 4 may automatically determine a coordinate space around the emitter based on the electromagnetic field. At 506, a behavior of the coils at the sensors (which may be attached to a known object) may be detected. For example, a current induced at the coils may be calculated. In other embodiments, a rotation of coils, or any other quantifiable behavior may be tracked and measured. At 508, this behavior may be used to detect a position and orientation of the sensor(s) and/or known object. For example, the controller 406 may consult a mapping table that correlates a behavior of the coils at the sensors to various positions or orientations. Based on these calculations, the position in the coordinate space along with the orientation of the sensors may be determined. In some embodiments, the pose/location information may be determined at the sensors. In other embodiment, the sensors communicate data detected at the sensors to the controller, and the controller may consult the mapping table to determined pose information relative to the known magnetic field (e.g., coordinates relative to the handheld component).

In the context of AR systems, one or more components of the electromagnetic tracking system may need to be modified to facilitate accurate tracking of mobile components. As described above, tracking the user's head pose and orientation is crucial in many AR applications. Accurate determination of the user's head pose and orientation allows the AR system to display the right virtual content to the user. For example, the virtual scene may comprise a monster hiding behind a real building. Depending on the pose and orientation of the user's head in relation to the building, the view of the virtual monster may need to be modified such that a realistic AR experience is provided. Or, a position and/or orientation of a totem, haptic device or some other means of interacting with a virtual content may be important in enabling the AR user to interact with the AR system. For example, in many gaming applications, the AR system must detect a position and orientation of a real object in relation to virtual content. Or, when displaying a virtual interface, a position of a totem, user's hand, haptic device or any other real object configured for interaction with the AR system must be known in relation to the displayed virtual interface in order for the system to understand a command, etc. Conventional localization methods including optical tracking and other methods are typically plagued with high latency and low resolution problems, which makes rendering virtual content challenging in many augmented reality applications.

In one or more embodiments, the electromagnetic tracking system, discussed in relation to FIGS. 4 and 5 may be adapted to the AR system to detect position and orientation of one or more objects in relation to an emitted electromagnetic field. Typical electromagnetic systems tend to have a large and bulky electromagnetic emitters (e.g., 402 in FIG. 4), which is problematic for AR devices. However, smaller electromagnetic emitters (e.g., in the millimeter range) may be used to emit a known electromagnetic field in the context of the AR system.

Referring now to FIG. 6, an electromagnetic tracking system may be incorporated with an AR system as shown, with an electromagnetic field emitter 602 incorporated as part of a hand-held controller 606. In one or more embodiments, the hand-held controller may be a totem to be used in a gaming scenario. In other embodiments, the hand-held controller may be a haptic device. In yet other embodiments, the electromagnetic field emitter may simply be incorporated as part of the belt pack 70. The hand-held controller 606 may comprise a battery 610 or other power supply that powers that electromagnetic field emitter 602. It should be appreciated that the electromagnetic field emitter 602 may also comprise or be coupled to an IMU 650 component configured to assist in determining positioning and/or orientation of the electromagnetic field emitter 602 relative to other components. This may be especially important in cases where both the field emitter 602 and the sensors (604) are mobile. Placing the electromagnetic field emitter 602 in the hand-held controller rather than the belt pack, as shown in the embodiment of FIG. 6, ensures that the electromagnetic field emitter is not competing for resources at the belt pack, but rather uses its own battery source at the hand-held controller 606.

In one or more embodiments, the electromagnetic sensors (604) may be placed on one or more locations on the user's headset (58), along with other sensing devices such as one or more IMUs or additional magnetic flux capturing coils (608). For example, as shown in FIG. 6, sensors (604, 608) may be placed on either side of the head set (58). Since these sensors (604, 608) are engineered to be rather small (and hence may be less sensitive, in some cases), having multiple sensors may improve efficiency and precision.

In one or more embodiments, one or more sensors may also be placed on the belt pack (620) or any other part of the user's body. The sensors (604, 608) may communicate wirelessly or through Bluetooth to a computing apparatus (607, e.g., the controller) that determines a pose and orientation of the sensors (604, 608) (and the AR headset (58) to which they are attached in relation to the known magnetic field emitted by the electromagnetic filed emitter (602)). In one or more embodiments, the computing apparatus (607) may reside at the belt pack (620). In other embodiments, the computing apparatus (607) may reside at the headset (58) itself, or even the hand-held controller (606). The computing apparatus (607) may receive the measurements of the sensors (604, 608), and determine a position and orientation of the sensors (604, 608) in relation to the known electromagnetic field emitted by the electromagnetic filed emitter (602).

The computing apparatus (607) may in turn comprise a mapping database (632; e.g., passable world model, coordinate space, etc.) to detect pose, to determine the coordinates of real objects and virtual objects, and may even connect to cloud resources (630) and the passable world model, in one or more embodiments. A mapping database (632) may be consulted to determine the location coordinates of the sensors (604, 608). The mapping database (632) may reside in the belt pack (620) in some embodiments. In the embodiment depicted in FIG. 6, the mapping database (632) resides on a cloud resource (630). The computing apparatus (607) communicates wirelessly to the cloud resource (630). The determined pose information in conjunction with points and images collected by the AR system may then be communicated to the cloud resource (630), and then be added to the passable world model (634).

As described above, conventional electromagnetic emitters may be too bulky for AR devices. Therefore the electromagnetic field emitter may be engineered to be compact, using smaller coils compared to traditional systems. However, given that the strength of the electromagnetic field decreases as a cubic function of the distance away from the field emitter, a shorter radius between the electromagnetic sensors 604 and the electromagnetic field emitter 602 (e.g., about 3-3.5 ft.) may reduce power consumption when compared to conventional systems such as the one detailed in FIG. 4.

This aspect may either be utilized to prolong the life of the battery 610 that may power the controller 606 and the electromagnetic field emitter 602, in one or more embodiments. Or, in other embodiments, this aspect may be utilized to reduce the size of the coils generating the magnetic field at the electromagnetic field emitter 602. However, in order to get the same strength of magnetic field, the power may be need to be increased. This allows for a compact electromagnetic field emitter unit 602 that may fit compactly at the hand-held controller 606.

Several other changes may be made when using the electromagnetic tracking system for AR devices. Although this pose reporting rate is rather good, AR systems may require an even more efficient pose reporting rate. To this end, IMU-based pose tracking may be used in the sensors. Crucially, the IMUs must remain as stable as possible in order to increase an efficiency of the pose detection process. The IMUs may be engineered such that they remain stable up to 50-100 milliseconds. It should be appreciated that some embodiments may utilize an outside pose estimator module (i.e., IMUs may drift over time) that may enable pose updates to be reported at a rate of 10-20 Hz. By keeping the IMUs stable at a reasonable rate, the rate of pose updates may be dramatically decreased to 10-20 Hz (as compared to higher frequencies in conventional systems).

If the electromagnetic tracking system can be run at a 10% duty cycle (e.g., only pinging for ground truth every 100 milliseconds), this would be another way to save power at the AR system. This would mean that the electromagnetic tracking system wakes up every 10 milliseconds out of every 100 milliseconds to generate a pose estimate. This directly translates to power consumption savings, which may, in turn, affect size, battery life and cost of the AR device.

In one or more embodiments, this reduction in duty cycle may be strategically utilized by providing two hand-held controllers (not shown) rather than just one. For example, the user may be playing a game that requires two totems, etc. Or, in a multi-user game, two users may have their own totems/hand-held controllers to play the game. When two controllers (e.g., symmetrical controllers for each hand) are used rather than one, the controllers may operate at offset duty cycles. The same concept may also be applied to controllers utilized by two different users playing a multi-player game, for example.

Figure 7:
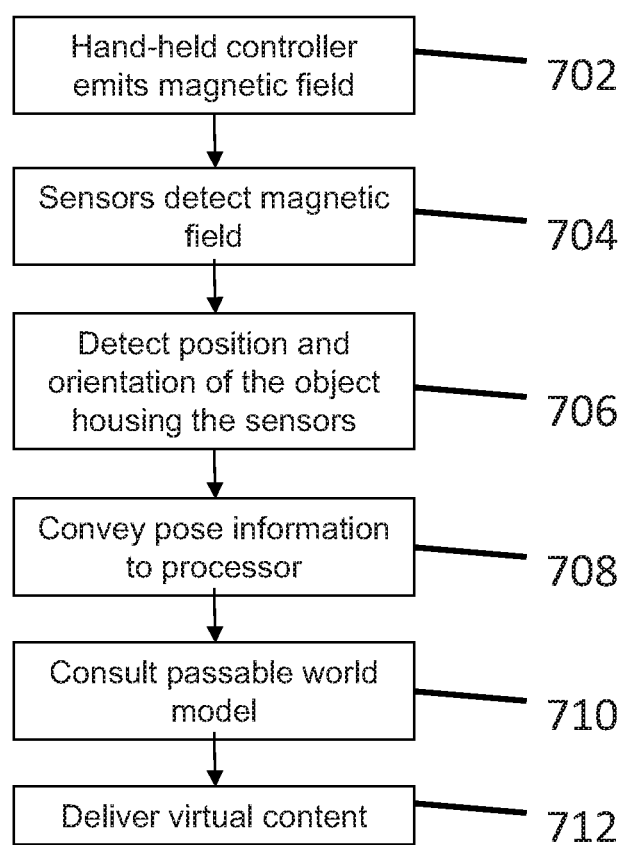
FIG. 7 illustrates an example method of delivering virtual content to a user based on detected head pose.

Referring now to FIG. 7, an example flow chart describing the electromagnetic tracking system in the context of AR devices is described. At 702, the hand-held controller emits a magnetic field. At 704, the electromagnetic sensors (placed on headset, belt pack, etc.) detect the magnetic field. At 706, a position and orientation of the headset/belt is determined based on a behavior of the coils/IMUs at the sensors. At 708, the pose information is conveyed to the computing apparatus (e.g., at the belt pack or headset). At 710, optionally, a mapping database (e.g., passable world model) may be consulted to correlate the real world coordinates with the virtual world coordinates. At 712, virtual content may be delivered to the user at the AR headset. It should be appreciated that the flowchart described above is for illustrative purposes only, and should not be read as limiting.

Advantageously, using an electromagnetic tracking system similar to the one outlined in FIG. 6 enables pose tracking (e.g., head position and orientation, position and orientation of totems, and other controllers). This allows the AR system to project virtual content with a higher degree of accuracy, and very low latency when compared to optical tracking techniques.

Figure 8:
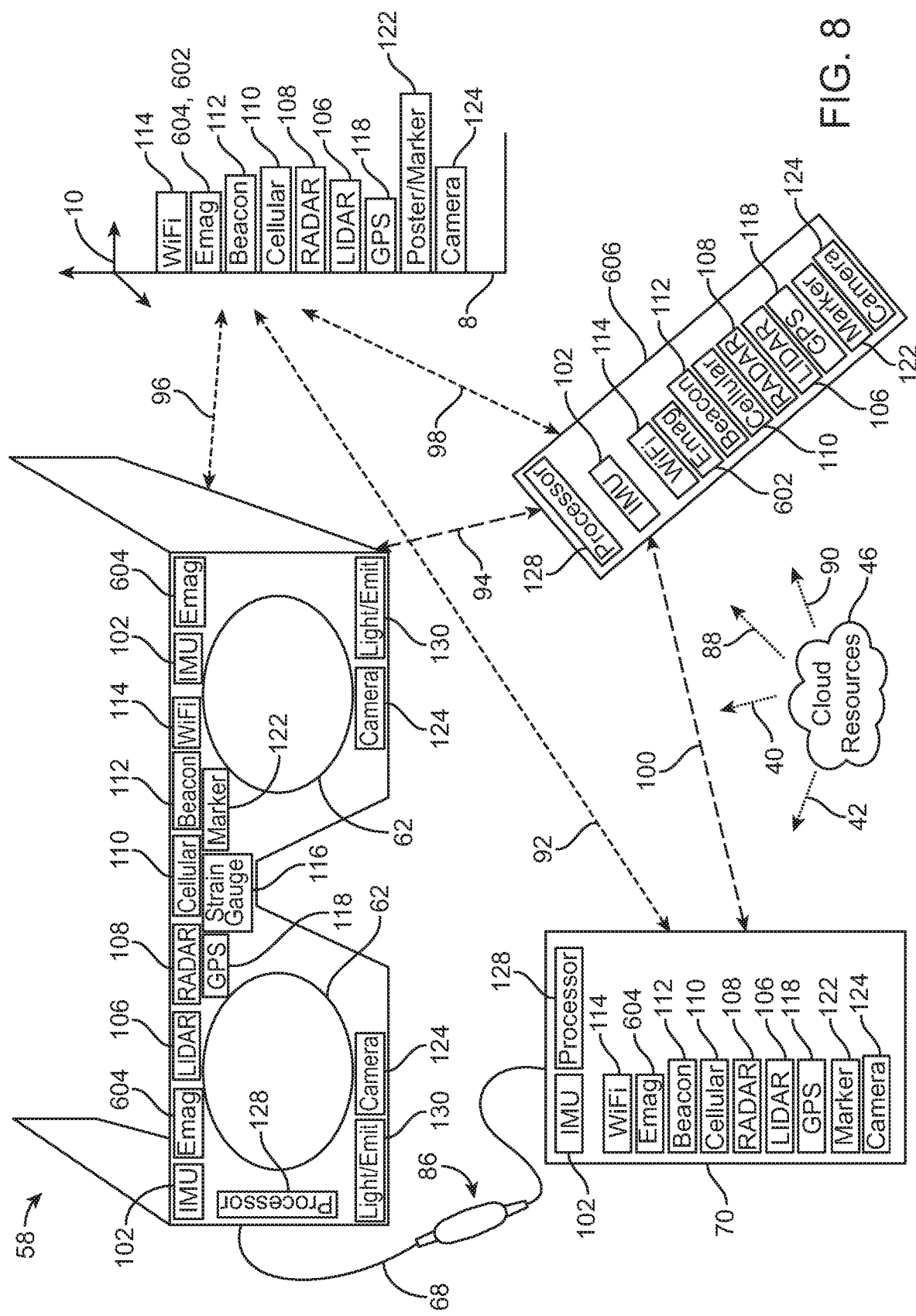
FIG. 8 illustrates a schematic view of various components of an AR system according to one embodiment having an electromagnetic transmitter and an electromagnetic sensor.

Referring to FIG. 8, a system configuration is illustrated wherein featuring many sensing components. A head mounted wearable component (58) is shown operatively coupled (68) to a local processing and data module (70), such as a belt pack, here using a physical multicore lead which also features a control and quick release module (86) as described below in reference to FIGS. 9A-9F. The local processing and data module (70) is operatively coupled (100) to a hand held component (606), here by a wireless connection such as low power Bluetooth; the hand held component (606) may also be operatively coupled (94) directly to the head mounted wearable component (58), such as by a wireless connection such as low power Bluetooth. Generally where IMU data is passed to coordinate pose detection of various components, a high-frequency connection is desirable, such as in the range of hundreds or thousands of cycles/second or higher; tens of cycles per second may be adequate for electromagnetic localization sensing, such as by the sensor (604) and transmitter (602) pairings. Also shown is a global coordinate system (10), representative of fixed objects in the real world around the user, such as a wall (8). Cloud resources (46) also may be operatively coupled (42, 40, 88, 90) to the local processing and data module (70), to the head mounted wearable component (58), to resources which may be coupled to the wall (8) or other item fixed relative to the global coordinate system (10), respectively. The resources coupled to the wall (8) or having known positions and/or orientations relative to the global coordinate system (10) may include a WiFi transceiver (114), an electromagnetic emitter (602) and/or receiver (604), a beacon or reflector (112) configured to emit or reflect a given type of radiation, such as an infrared LED beacon, a cellular network transceiver (110), a RADAR emitter or detector (108), a LIDAR emitter or detector (106), a GPS transceiver (118), a poster or marker having a known detectable pattern (122), and a camera (124). The head mounted wearable component (58) features similar components, as illustrated, in addition to lighting emitters (130) configured to assist the camera (124) detectors, such as infrared emitters (130) for an infrared camera (124); also featured on the head mounted wearable component (58) are one or more strain gauges (116), which may be fixedly coupled to the frame or mechanical platform of the head mounted wearable component (58) and configured to determine deflection of such platform in between components such as electromagnetic receiver sensors (604) or display elements (62), wherein it may be valuable to understand if bending of the platform has occurred, such as at a thinned portion of the platform, such as the portion above the nose on the eyeglasses-like platform depicted in FIG. 8. The head mounted wearable component (58) also features a processor (128) and one or more IMUs (102). Each of the components preferably are operatively coupled to the processor (128). The hand held component (606) and local processing and data module (70) are illustrated featuring similar components. As shown in FIG. 8, with so many sensing and connectivity means, such a system is likely to be heavy, power hungry, large, and relatively expensive. However, for illustrative purposes, such a system may be utilized to provide a very high level of connectivity, system component integration, and position/orientation tracking. For example, with such a configuration, the various main mobile components (58, 70, 606) may be localized in terms of position relative to the global coordinate system using WiFi, GPS, or Cellular signal triangulation; beacons, electromagnetic tracking (as described above), RADAR, and LIDIR systems may provide yet further location and/or orientation information and feedback. Markers and cameras also may be utilized to provide further information regarding relative and absolute position and orientation. For example, the various camera components (124), such as those shown coupled to the head mounted wearable component (58), may be utilized to capture data which may be utilized in simultaneous localization and mapping protocols, or "SLAM", to determine where the component (58) is and how it is oriented relative to other components.

Figures 9D, 9E:
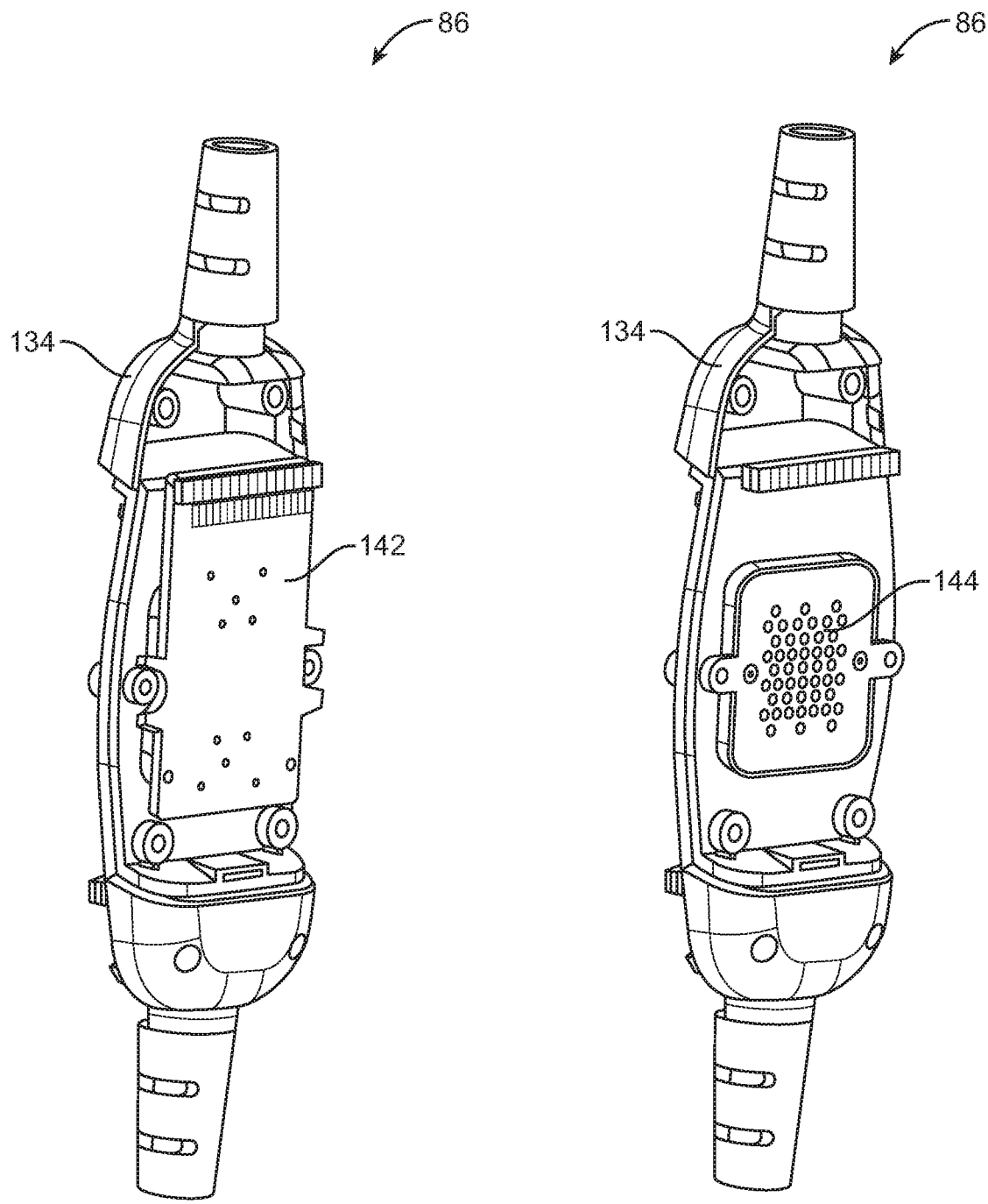
Figure 9F:
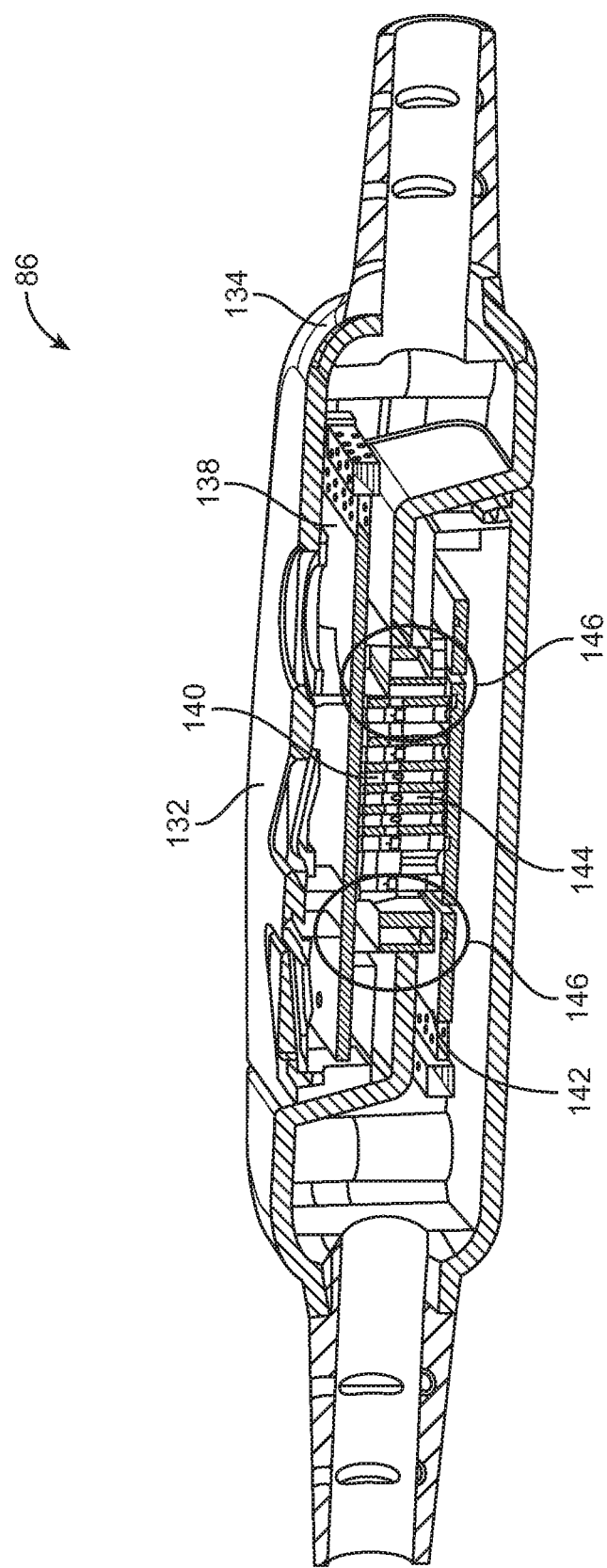

Referring to FIGS. 9A-9F, various aspects of the control and quick release module (86) are depicted. Referring to FIG. 9A, two outer housing components are coupled together using a magnetic coupling configuration which may be enhanced with mechanical latching. Buttons (136) for operation of the associated system may be included. FIG. 9B illustrates a partial cutaway view with the buttons (136) and underlying top printed circuit board (138) shown. Referring to FIG. 9C, with the buttons (136) and underlying top printed circuit board (138) removed, a female contact pin array (140) is visible. Referring to FIG. 9D, with an opposite portion of housing (134) removed, the lower printed circuit board (142) is visible. With the lower printed circuit board (142) removed, as shown in FIG. 9E, a male contact pin array (144) is visible. Referring to the cross-sectional view of FIG. 9F, at least one of the male pins or female pins are configured to be spring-loaded such that they may be depressed along each pin's longitudinal axis; the pins may be termed "pogo pins" and generally comprise a highly conductive material, such as copper or gold. When assembled, the illustrated configuration mates 46 male pins with female pins, and the entire assembly may be quick-release decoupled in half by manually pulling it apart and overcoming a magnetic interface (146) load which may be developed using north and south magnets oriented around the perimeters of the pin arrays (140, 144). In one embodiment, an approximate 2 kg load from compressing the 46 pogo pins is countered with a closure maintenance force of about 4 kg. The pins in the array may be separated by about 1.3 mm, and the pins may be operatively coupled to conductive lines of various types, such as twisted pairs or other combinations to support USB 3.0, HDMI 2.0, I2S signals, GPIO, and MIPI configurations, and high current analog lines and grounds configured for up to about 4 amps/5 volts in one embodiment.

Figure 10:
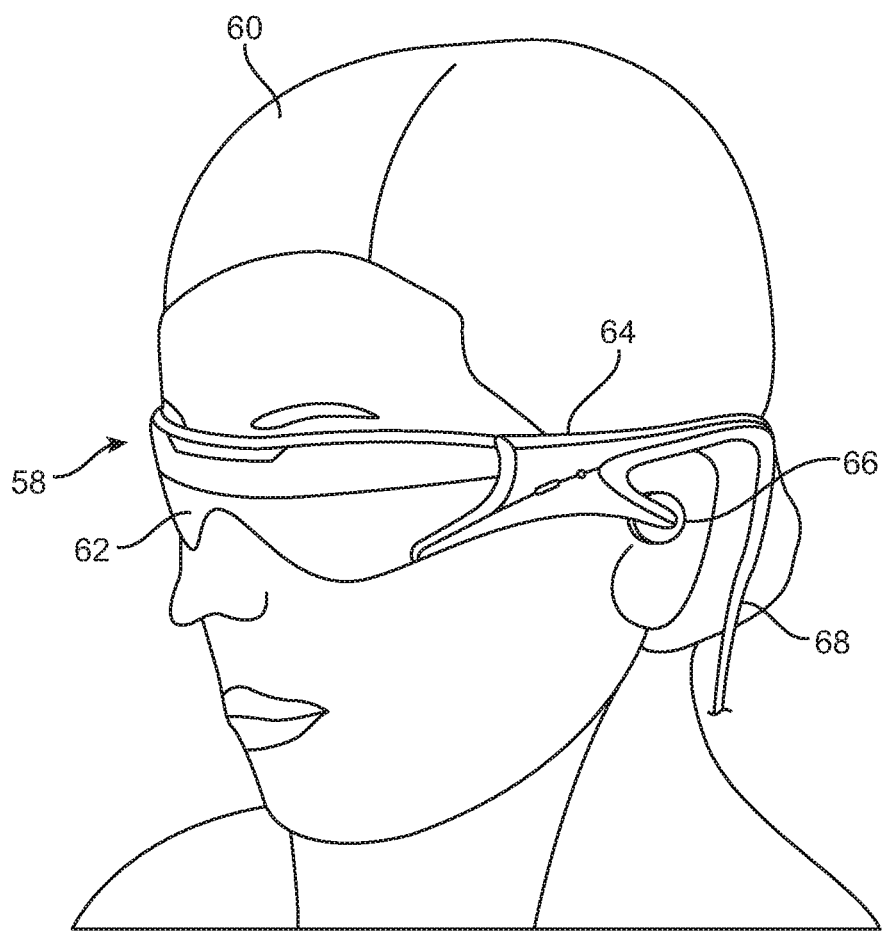
FIG. 10 illustrates one simplified embodiment of a wearable AR device.

Referring to FIG. 10, it is helpful to have a minimized component/feature set to be able to minimize the weight and bulk of the various components, and to arrive at a relatively slim head mounted component, for example, such as that (58) featured in FIG. 10. Thus various permutations and combinations of the various components shown in FIG. 8 may be utilized.

Figure 11A:
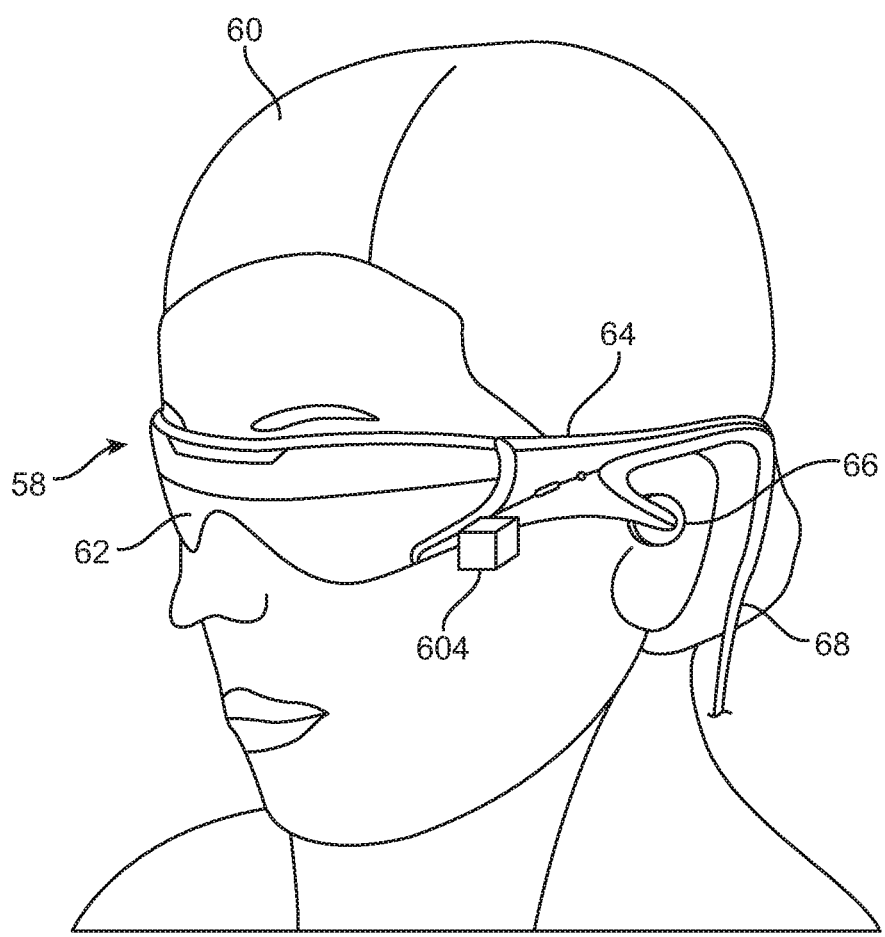
FIGS. 11A and 11B illustrate various embodiments of placement of the electromagnetic sensors on head-mounted AR systems.
Figure 11B:
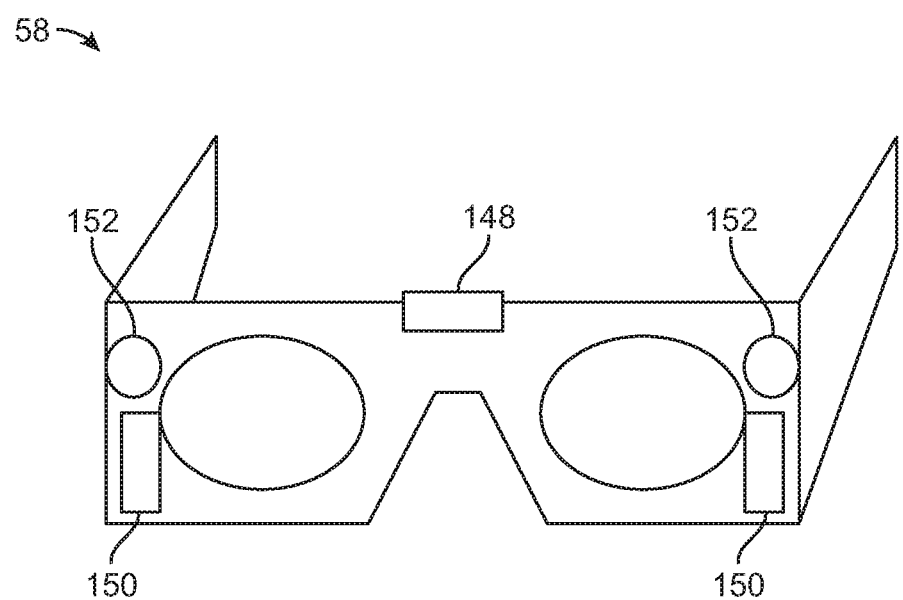

Referring to FIG. 11A, an electromagnetic sensing coil assembly (604, i.e., 3 individual coils coupled to a housing) is shown coupled to a head mounted component (58); such a configuration adds additional geometry to the overall assembly which may not be desirable. Referring to FIG. 11B, rather than housing the coils in a box or single housing as in the configuration of FIG. 11A, the individual coils may be integrated into the various structures of the head mounted component (58), as shown in FIG. 11B. For example, x-axis coil (148) may be placed in one portion of the head mounted component (58) (e.g., the center of the frame). Similarly, the y-axis coil (150) may be placed in another portion of the head mounted component (58; e.g., either bottom side of the frame). Similarly, the z-axis coil (152) may be placed in yet another portion of the head mounted component (58) (e.g., either top side of the frame).

FIGS. 12A-12E illustrate various configurations for featuring a ferrite core coupled to an electromagnetic sensor to increase field sensitivity. Referring to FIG. 12A, the ferrite core may be a solid cube (1202). Although the solid cube (1202) may be most effective in increasing field sensitivity, it may also be the most heavy when compared to the remaining configurations depicted in FIGS. 12B-12E. Referring to FIG. 12B, a plurality of ferrite disks (1204) may be coupled to the electromagnetic sensor. Similarly, referring to FIG. 12C, a solid cube with a one axis air core (1206) may be coupled to the electromagnetic sensor. As shown in FIG. 12C, an open space (i.e., the air core) may be formed in the solid cube along one axis. This may decrease the weight of the cube, while still providing the necessary field sensitivity. In yet another embodiment, referring to FIG. 12D, a solid cube with a three axis air core (1208) may be coupled to the electromagnetic sensor. In this configuration, the solid cube is hollowed out along all three axes, thereby decreasing the weight of the cube considerably. Referring to FIG. 12E, ferrite rods with plastic housing (1210) may also be coupled to the electromagnetic sensor. It should be appreciated that the embodiments of FIGS. 12B-12E are lighter in weight than the solid core configuration of FIG. 12A and may be utilized to save mass, as discussed above.

Figure 13A:
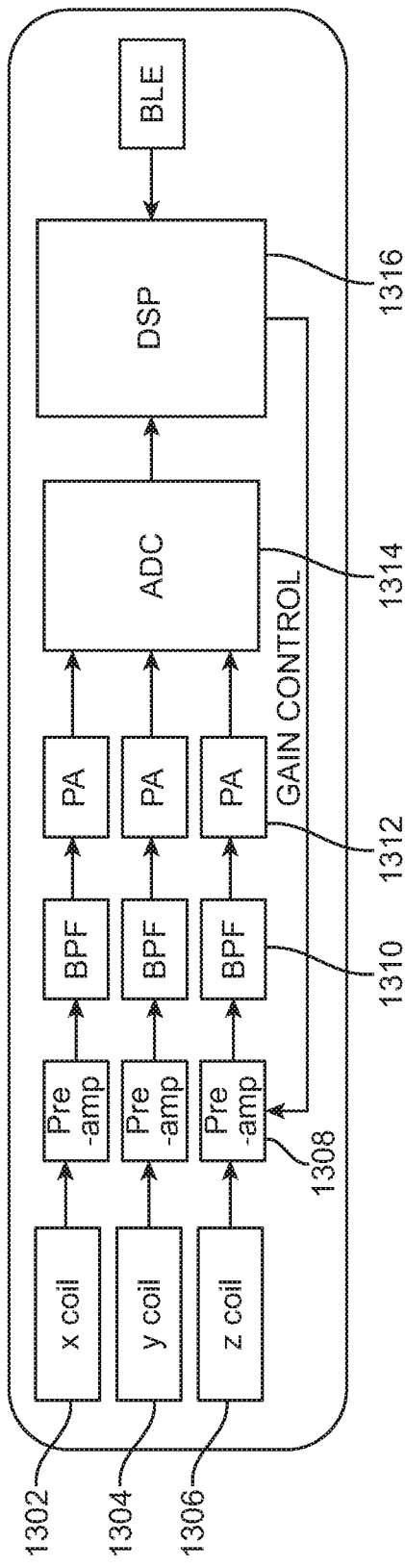
FIG. 13A-13C illustrate various embodiments of data processors for electromagnetic sensors.
Figure 13B:
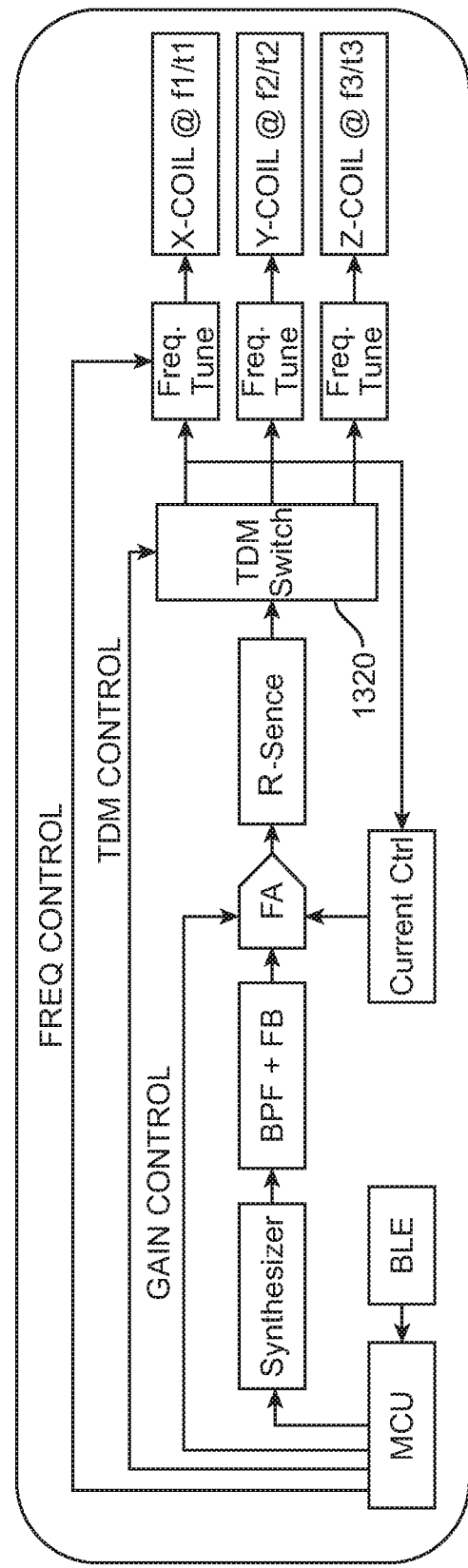
Figure 13C:
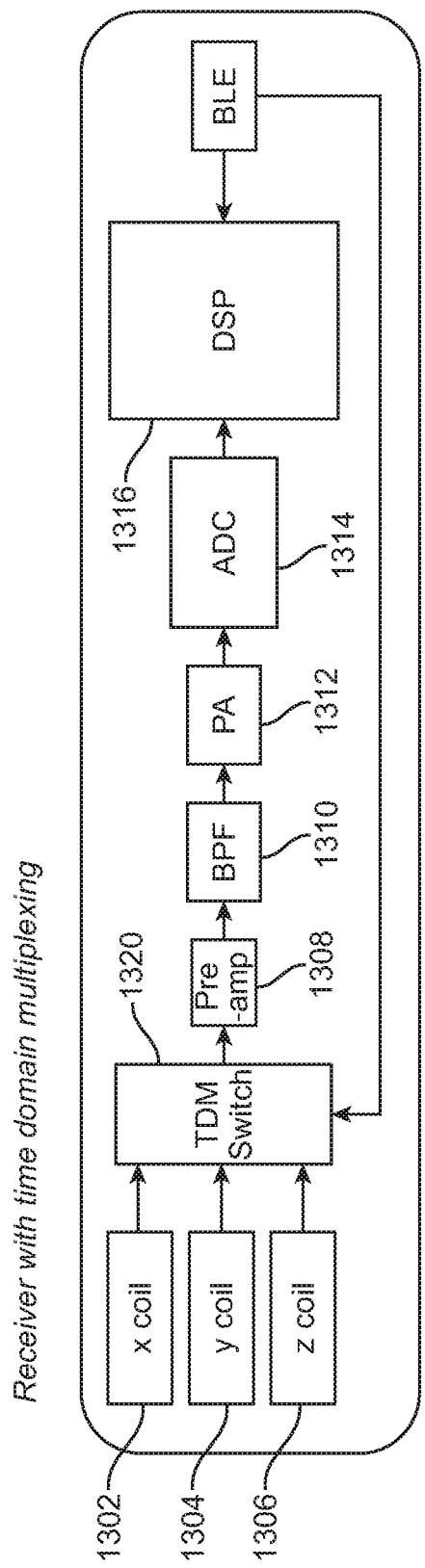

Referring to FIGS. 13A-13C, time division multiplexing ("TDM") may be utilized to save mass as well. For example, referring to FIG. 13A, a conventional local data processing configuration is shown for a 3-coil electromagnetic receiver sensor, wherein analog currents come in from each of the X, Y, and Z coils (1302, 1304, 1306), go into a pre-amplifier (1308), go into a band pass filter (1310), a PA (1312), through analog-to-digital conversion (1314), and ultimately to a digital signal processor (1316). Referring to the transmitter configuration of FIG. 13B, and the receiver configuration of FIG. 13C, time division multiplexing may be utilized to share hardware, such that each coil sensor chain doesn't require its own amplifiers, etc. This may be achieved through a TDM switch 1320, as shown in FIG. 13B, which facilitates processing of signals to and from multiple transmitters and receivers using the same set of hardware components (amplifiers, etc.) In addition to removing sensor housings, and multiplexing to save on hardware overhead, signal to noise ratios may be increased by having more than one set of electromagnetic sensors, each set being relatively small relative to a single larger coil set; also the low-side frequency limits, which generally are needed to have multiple sensing coils in close proximity, may be improved to facilitate bandwidth requirement improvements. Also, there is a tradeoff with multiplexing, in that multiplexing generally spreads out the reception of radiofrequency signals in time, which results in generally dirtier signals; thus larger coil diameter may be required for multiplexed systems. For example, where a multiplexed system may require a 9 mm-side dimension cubic coil sensor box, a nonmultiplexed system may only require a 7 mm-side dimension cubic coil box for similar performance; thus there are tradeoffs in minimizing geometry and mass.

In another embodiment wherein a particular system component, such as a head mounted component (58) features two or more electromagnetic coil sensor sets, the system may be configured to selectively utilize the sensor and emitter pairing that are closest to each other to optimize the performance of the system.

Figure 14:
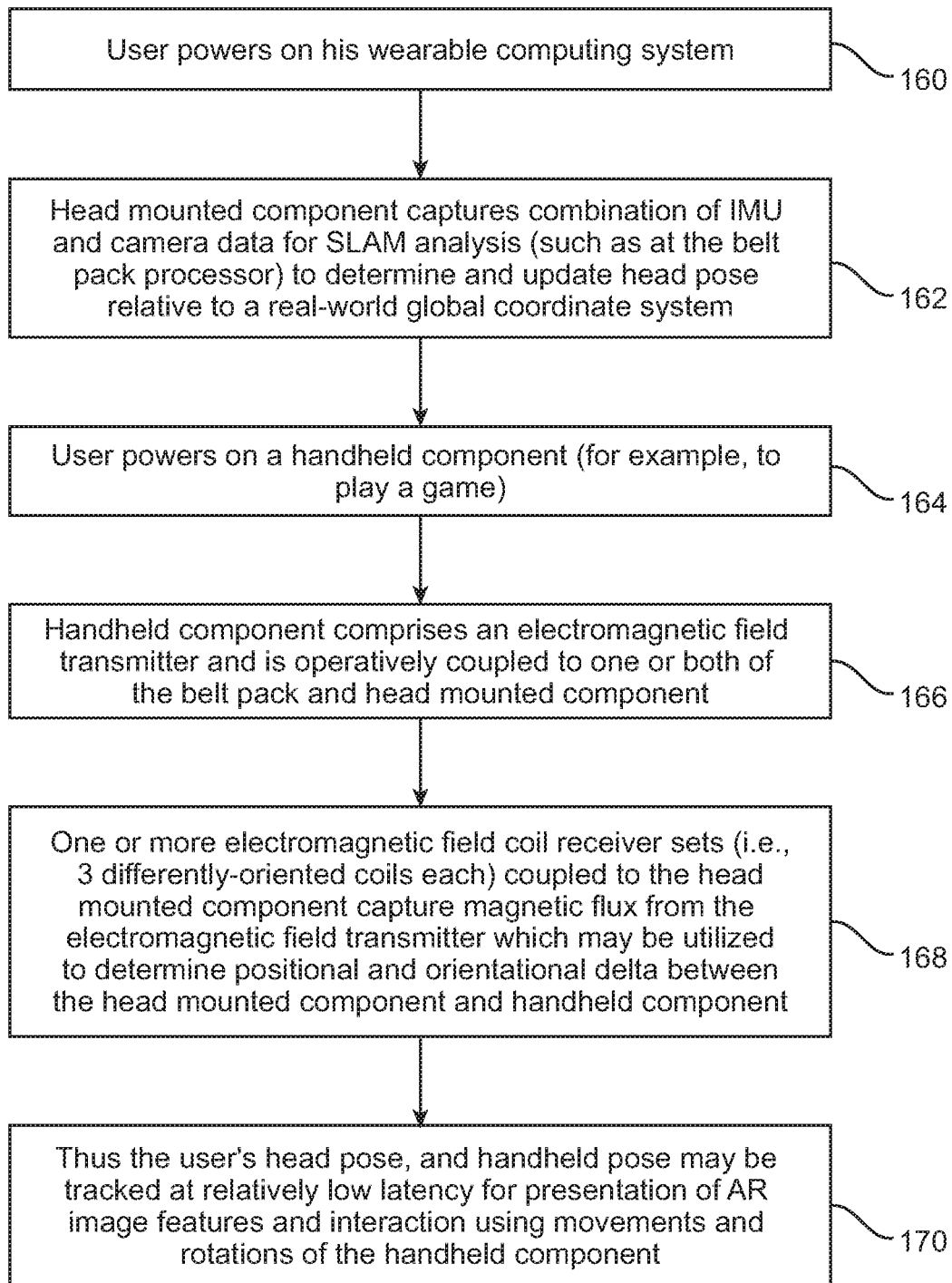
FIG. 14 illustrates an example method of using an electromagnetic tracking system to detect head and hand pose.

Referring to FIG. 14, in one embodiment, after a user powers up his or her wearable computing system (160), a head mounted component assembly may capture a combination of IMU and camera data (the camera data being used, for example, for SLAM analysis, such as at the belt pack processor where there may be more raw processing horsepower present) to determine and update head pose (i.e., position and orientation) relative to a real world global coordinate system (162). The user may also activate a handheld component to, for example, play an augmented reality game (164), and the handheld component may comprise an electromagnetic transmitter operatively coupled to one or both of the belt pack and head mounted component (166). One or more electromagnetic field coil receiver sets (i.e., a set being 3 differently-oriented individual coils) coupled to the head mounted component to capture magnetic flux from the transmitter, which may be utilized to determine positional or orientational difference (or "delta"), between the head mounted component and handheld component (168). The combination of the head mounted component assisting in determining pose relative to the global coordinate system, and the hand held assisting in determining relative location and orientation of the handheld relative to the head mounted component, allows the system to generally determine where each component is relative to the global coordinate system, and thus the user's head pose, and handheld pose may be tracked, preferably at relatively low latency, for presentation of augmented reality image features and interaction using movements and rotations of the handheld component (170).

Figure 15:
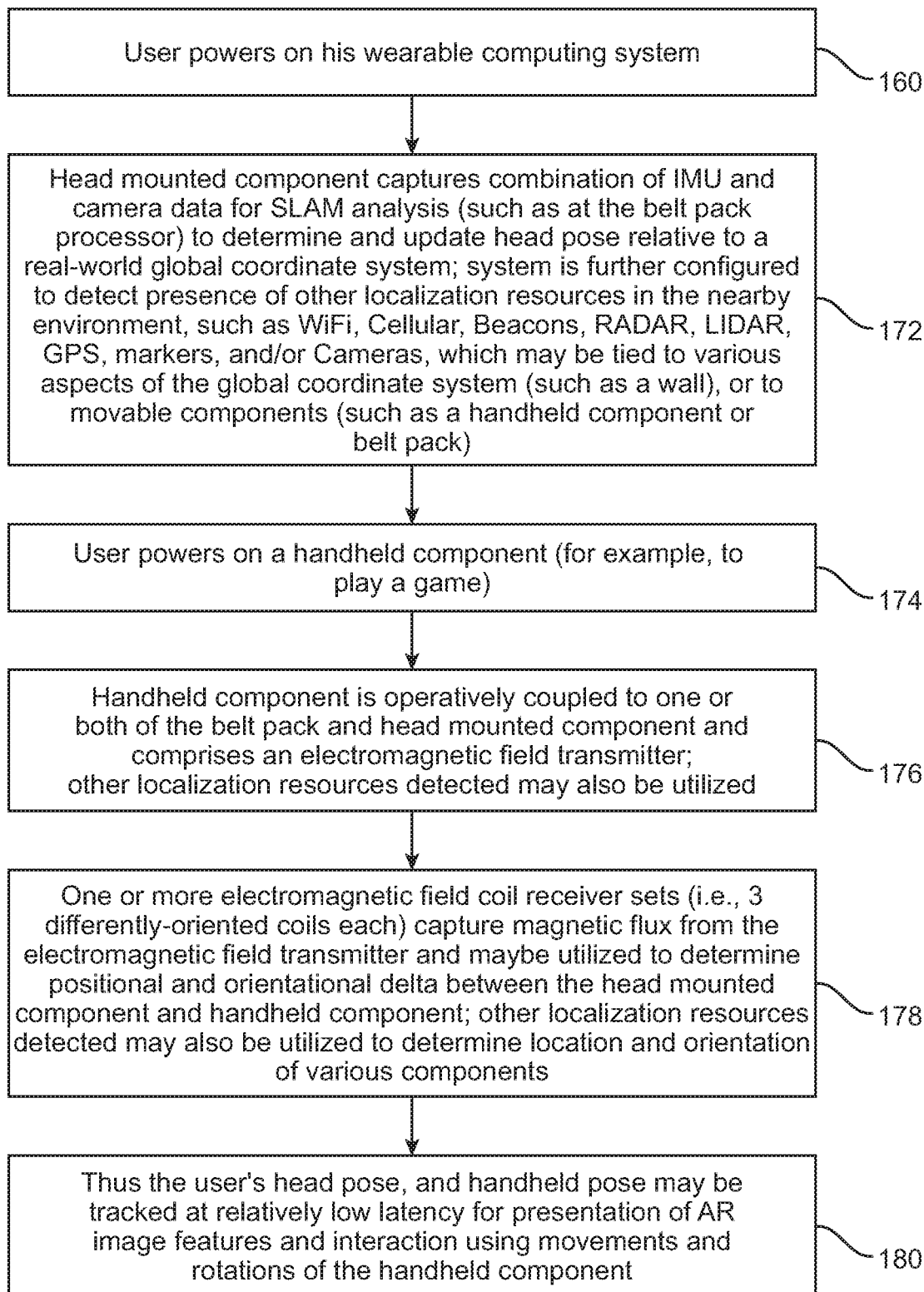
FIG. 15 illustrates another example method of using an electromagnetic tracking system to detect head and hand pose.

Referring to FIG. 15, an embodiment is illustrated that is somewhat similar to that of FIG. 14, with the exception that the system has many more sensing devices and configurations available to assist in determining pose of both the head mounted component (172) and a hand held component (176, 178), such that the user's head pose, and handheld pose may be tracked, preferably at relatively low latency, for presentation of augmented reality image features and interaction using movements and rotations of the handheld component (180).

Specifically, after a user powers up his or her wearable computing system (160), a head mounted component captures a combination of IMU and camera data for SLAM analysis in order to determined and update head pose relative a real-world global coordinate system. The system may be further configured to detect presence of other localization resources in the environment, like Wi-Fi, cellular, beacons, RADAR, LIDAR, GPS, markers, and/or other cameras which may be tied to various aspects of the global coordinate system, or to one or more movable components (172).

The user may also activate a handheld component to, for example, play an augmented reality game (174), and the handheld component may comprise an electromagnetic transmitter operatively coupled to one or both of the belt pack and head mounted component (176). Other localization resources may also be similarly utilized. One or more electromagnetic field coil receiver sets (e.g., a set being 3 differently-oriented individual coils) coupled to the head mounted component may be used to capture magnetic flux from the electromagnetic transmitter. This captured magnetic flux may be utilized to determine positional or orientational difference (or "delta"), between the head mounted component and handheld component (178).

Thus, the user's head pose and the handheld pose may be tracked at relatively low latency for presentation of AR content and/or for interaction with the AR system using movement or rotations of the handheld component (180).

Figure 16B:
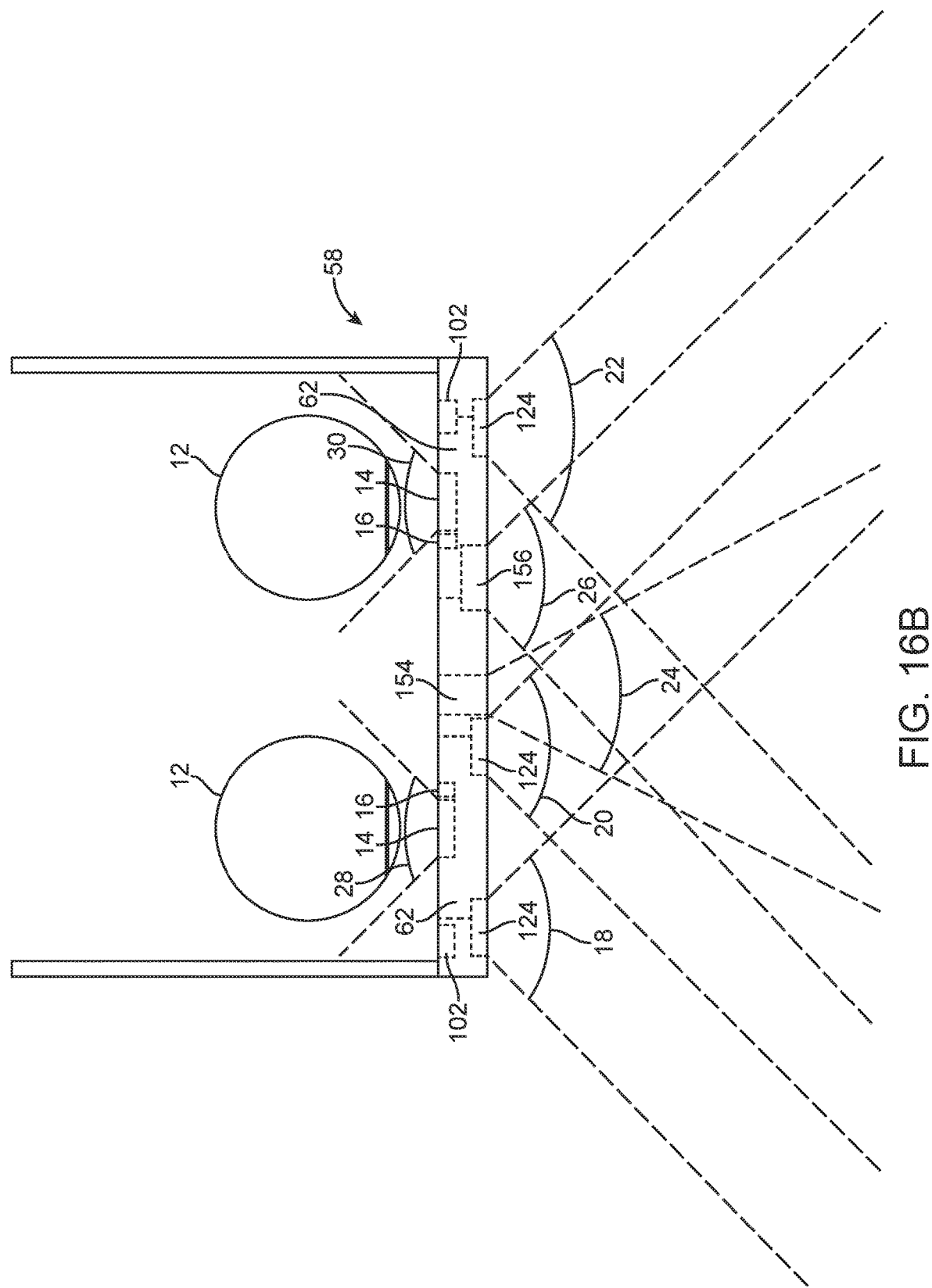
FIG. 16B illustrates a schematic view of various components of an AR system and various fields of view according to still another embodiment having a depth sensor, an electromagnetic transmitter and an electromagnetic sensor.

Referring to FIGS. 16A and 16B, various aspects of a configuration similar to that of FIG. 8 are shown. The configuration of FIG. 16A differs from that of FIG. 8 in that in addition to a LIDAR (106) type of depth sensor, the configuration of FIG. 16A features a generic depth camera or depth sensor (154) for illustrative purposes, which may, for example, be either a stereo triangulation style depth sensor (such as a passive stereo depth sensor, a texture projection stereo depth sensor, or a structured light stereo depth sensor) or a time of flight style depth sensor (such as a LIDAR depth sensor or a modulated emission depth sensor); further, the configuration of FIG. 16A has an additional forward facing "world" camera (124, which may be a grayscale camera, having a sensor capable of 720p range resolution) as well as a relatively high-resolution "picture camera" (156, which may be a full color camera, having a sensor capable of 2 megapixel or higher resolution, for example). FIG. 16B shows a partial orthogonal view of the configuration of FIG. 16A for illustrative purposes, as described further below in reference to FIG. 16B.

Referring back to FIG. 16A and the stereo vs time-of-flight style depth sensors mentioned above, each of these depth sensor types may be employed with a wearable computing solution as disclosed herein, although each has various advantages and disadvantages. For example, many depth sensors have challenges with black surfaces and shiny or reflective surfaces. Passive stereo depth sensing is a relatively simplistic way of getting triangulation for calculating depth with a depth camera or sensor, but it may be challenged if a wide field of view ("FOV") is required, and may require relatively significant computing resource; further, such a sensor type may have challenges with edge detection, which may be important for the particular use case at hand. Passive stereo may have challenges with textureless walls, low light situations, and repeated patterns. Passive stereo depth sensors are available from manufacturers such as Intel® and Aquifi®. Stereo with texture projection (also known as "active stereo") is similar to passive stereo, but a texture projector broadcasts a projection pattern onto the environment, and the more texture that is broadcasted, the more accuracy is available in triangulating for depth calculation. Active stereo may also require relatively high compute resource, present challenges when wide FOV is required, and be somewhat suboptimal in detecting edges, but it does address some of the challenges of passive stereo in that it is effective with textureless walls, is good in low light, and generally does not have problems with repeating patterns. Active stereo depth sensors are available from manufacturers such as Intel® and Aquifi®. Stereo with structured light, such as the systems developed by Primesense, Inc.® and available under the tradename Kinect®, as well as the systems available from Mantis Vision, Inc.®, generally utilize a single camera/projector pairing, and the projector is specialized in that it is configured to broadcast a pattern of dots that is known apriori. In essence, the system knows the pattern that is broadcasted, and it knows that the variable to be determined is depth. Such configurations may be relatively efficient on compute load, and may be challenged in wide FOV requirement scenarios as well as scenarios with ambient light and patterns broadcasted from other nearby devices, but can be quite effective and efficient in many scenarios. With modulated time of flight type depth sensors, such as those available from PMD Technologies®, A.G. and SoftKinetic Inc.®, an emitter may be configured to send out a wave, such as a sine wave, of amplitude modulated light; a camera component, which may be positioned nearby or even overlapping in some configurations, receives a returning signal on each of the pixels of the camera component and depth mapping may be determined/calculated. Such configurations may be relatively compact in geometry, high in accuracy, and low in compute load, but may be challenged in terms of image resolution (such as at edges of objects), multi-path errors (such as wherein the sensor is aimed at a reflective or shiny corner and the detector ends up receiving more than one return path, such that there is some depth detection aliasing. Direct time of flight sensors, which also may be referred to as the aforementioned LIDAR, are available from suppliers such as LuminAR® and Advanced Scientific Concepts, Inc.®. With these time of flight configurations, generally a pulse of light (such as a picosecond, nanosecond, or femtosecond long pulse of light) is sent out to bathe the world oriented around it with this light ping; then each pixel on a camera sensor waits for that pulse to return, and knowing the speed of light, the distance at each pixel may be calculated. Such configurations may have many of the advantages of modulated time of flight sensor configurations (no baseline, relatively wide FOV, high accuracy, relatively low compute load, etc.) and also relatively high framerates, such as into the tens of thousands of Hertz. They may also be relatively expensive, have relatively low resolution, be sensitive to bright light, and susceptible to multi-path errors; they may also be relatively large and heavy.

Referring to FIG. 16B, a partial top view is shown for illustrative purposes featuring a user's eyes (12) as well as cameras (14, such as infrared cameras) with fields of view (28, 30) and light or radiation sources (16, such as infrared) directed toward the eyes (12) to facilitate eye tracking, observation, and/or image capture. The three outward-facing world-capturing cameras (124) are shown with their FOVs (18, 20, 22), as is the depth camera (154) and its FOV (24), and the picture camera (156) and its FOV (26). The depth information garnered from the depth camera (154) may be bolstered by using the overlapping FOVs and data from the other forward-facing cameras. For example, the system may end up with something like a sub-VGA image from the depth sensor (154), a 720p image from the world cameras (124), and occasionally a 2 megapixel color image from the picture camera (156). Such a configuration has five cameras sharing common FOV, three of them with heterogeneous visible spectrum images, one with color, and the third one with relatively low-resolution depth. The system may be configured to do a segmentation in the grayscale and color images, fuse those images and make a relatively high-resolution image from them, get some stereo correspondences, use the depth sensor to provide hypotheses about stereo depth, and use stereo correspondences to get a more refined depth map, which may be significantly better than what was available from the depth sensor only. Such processes may be run on local mobile processing hardware, or can run using cloud computing resources, perhaps along with the data from others in the area (such as two people sitting across a table from each other nearby), and end up with quite a refined mapping. In another embodiment, all of the above sensors may be combined into one integrated sensor to accomplish such functionality.

Various exemplary embodiments of the invention are described herein. Reference is made to these examples in a non-limiting sense. They are provided to illustrate more broadly applicable aspects of the invention. Various changes may be made to the invention described and equivalents may be substituted without departing from the true spirit and scope of the invention. In addition, many modifications may be made to adapt a particular situation, material, composition of matter, process, process act(s) or step(s) to the objective(s), spirit or scope of the present invention. Further, as will be appreciated by those with skill in the art that each of the individual variations described and illustrated herein has discrete components and features which may be readily separated from or combined with the features of any of the other several embodiments without departing from the scope or spirit of the present inventions. All such modifications are intended to be within the scope of claims associated with this disclosure.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

Exemplary aspects of the invention, together with details regarding material selection and manufacture have been set forth above. As for other details of the present invention, these may be appreciated in connection with the above-referenced patents and publications as well as generally known or appreciated by those with skill in the art. The same may hold true with respect to method-based aspects of the invention in terms of additional acts as commonly or logically employed.

In addition, though the invention has been described in reference to several examples optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. In addition, where a range of values is provided, it is understood that every intervening value, between the upper and lower limit of that range and any other stated or intervening value in that stated range, is encompassed within the invention.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in claims associated hereto, the singular forms "a," "an," "said," and "the" include plural referents unless the specifically stated otherwise. In other words, use of the articles allow for "at least one" of the subject item in the description above as well as claims associated with this disclosure. It is further noted that such claims may be drafted to exclude any optional element. As such, this statement is intended to serve as antecedent basis for use of such exclusive terminology as "solely," "only" and the like in connection with the recitation of claim elements, or use of a "negative" limitation.

Without the use of such exclusive terminology, the term "comprising" in claims associated with this disclosure shall allow for the inclusion of any additional element—irrespective of whether a given number of elements are enumerated in such claims, or the addition of a feature could be regarded as transforming the nature of an element set forth in such claims. Except as specifically defined herein, all technical and scientific terms used herein are to be given as broad a commonly understood meaning as possible while maintaining claim validity.

The breadth of the present invention is not to be limited to the examples provided and/or the subject specification, but rather only by the scope of claim language associated with this disclosure.

The invention claimed is:

1. An augmented reality (AR) display system, comprising:
   a hand-held component coupled to an electromagnetic field emitter, the electromagnetic field emitter emitting a magnetic field;
   a head-mounted component having a display system that displays virtual content to a user, the head mounted component coupled to an electromagnetic sensor measuring a parameter related to a magnetic flux at the electromagnetic sensor resulting from the magnetic field, wherein a head pose of the head-mounted component in a known coordinate system is known;
   a depth sensor measuring a distance in the known coordinate system, wherein the depth sensor comprises a depth camera having a first field of view (FOV);
   a world capture camera, wherein the world capture camera has a second FOV at least partially overlapping with the first FOV;
   a picture camera, wherein the picture camera has a third FOV at least partially overlapping with the first FOV and the second FOV; and
   a controller communicatively coupled to the hand-held component, the head-mounted component, and the depth sensor, the controller receiving the parameter related to the magnetic flux at the electromagnetic sensor from the head mounted component and receiving the distance from the depth sensor,
   wherein the controller determines a hand pose of the hand-held component based at least in part on the parameter related to the magnetic flux measured by the electromagnetic sensor and the distance measured by the depth sensor,
   wherein the depth camera, the world capture camera, and the picture camera are configured to capture respective first, second, and third images,
   wherein the controller is programmed to
     segment the second and third images, and
     fuse the second and third images after segmenting the second and third images to generate a fused image, and
   wherein measuring the distance in the known coordinate system comprises:
     generating a hypothetical distance by analyzing the first image from the depth camera; and
     generating the distance by analyzing the hypothetical distance and the fused image.

2. The AR display system of claim 1, wherein the depth camera, the world capture camera, and the picture camera have respective different first, second, and third resolutions.

3. The AR display system of claim 2, wherein the first resolution of the depth camera is sub-VGA, the second resolution of the world capture camera is 720p, and the third resolution of the picture camera is 2 megapixels.

4. The AR display system of claim 1, wherein the depth camera, the world capture camera, and the picture camera form a single integrated sensor.

5. The AR display system of claim 1, wherein the hand pose comprises a position and an orientation of the hand-held component in the known coordinate system.

6. The AR display system of claim 1, wherein the world capture camera is a grayscale camera.

7. The AR display system of claim 1, wherein the picture camera is a color camera.

8. The AR display system of claim 1, further comprising analyzing the fused image to generate a plurality of stereo correspondences.

9. The AR display system of claim 8, wherein generating the distance by analyzing the hypothetical distance and the fused image comprises analyzing the hypothetical distance and the plurality of stereo correspondences.

* * * * *